(12) United States Patent
Nakaki

(10) Patent No.: US 8,884,356 B2
(45) Date of Patent: Nov. 11, 2014

(54) NONVOLATILE SEMICONDUCTOR MEMORY DEVICE AND METHOD FOR MANUFACTURING SAME

(71) Applicant: Kabushiki Kaisha Toshiba, Tokyo (JP)

(72) Inventor: Hiroshi Nakaki, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/848,266

(22) Filed: Mar. 21, 2013

(65) Prior Publication Data

US 2014/0061767 A1   Mar. 6, 2014

Related U.S. Application Data

(60) Provisional application No. 61/697,093, filed on Sep. 5, 2012.

(51) Int. Cl.
  *H01L 29/792* (2006.01)
  *H01L 27/088* (2006.01)
  *H01L 29/66* (2006.01)

(52) U.S. Cl.
  CPC ........ *H01L 27/088* (2013.01); *H01L 29/66833* (2013.01); *H01L 29/7926* (2013.01)
  USPC .......................................... 257/324; 438/586

(58) Field of Classification Search
  USPC .......................................... 257/324; 438/586
  See application file for complete search history.

(56) References Cited

U.S. PATENT DOCUMENTS

| | | |
|---|---|---|
| 2007/0252201 A1 | 11/2007 | Kito et al. |
| 2008/0099819 A1 | 5/2008 | Kito et al. |
| 2008/0253183 A1 | 10/2008 | Mizukami et al. |
| 2010/0096682 A1 | 4/2010 | Fukuzumi et al. |
| 2010/0207195 A1 | 8/2010 | Fukuzumi et al. |
| 2010/0320526 A1 | 12/2010 | Kidoh et al. |

FOREIGN PATENT DOCUMENTS

| | | |
|---|---|---|
| JP | 2007-266143 A | 10/2007 |
| JP | 2008-103429 A | 5/2008 |
| JP | 2008-263029 A | 10/2008 |
| JP | 2009-146954 A | 7/2009 |
| JP | 2010-98235 A | 4/2010 |
| JP | 2011-3833 A | 1/2011 |
| JP | 2011-49561 A | 3/2011 |

*Primary Examiner* — Marvin Payen
(74) *Attorney, Agent, or Firm* — Oblon, Spivak, McClelland, Maier & Neustadt, L.L.P.

(57) ABSTRACT

According to one embodiment, a nonvolatile semiconductor memory device includes: a stacked body provided on a foundation layer and including a plurality of electrode layers and a plurality of insulating layers alternately stacked; a plurality of first channel body layers; a memory film; a first interlayer insulating film; a plurality of select gate electrodes; a second channel body layer being connected to each of the plurality of first channel body layers; and a gate insulating film. The stacked body is bent. The first interlayer insulating film includes a slit extending in a direction generally parallel to the upper surface of the stacked body, the slit extends in a direction non-parallel to a first direction in which each end surface of the plurality of electrode layers extends. Part of at least one end surface of the plurality of electrode layers is part of bottom of the slit.

11 Claims, 23 Drawing Sheets

FIG. 4A
FIG. 4B
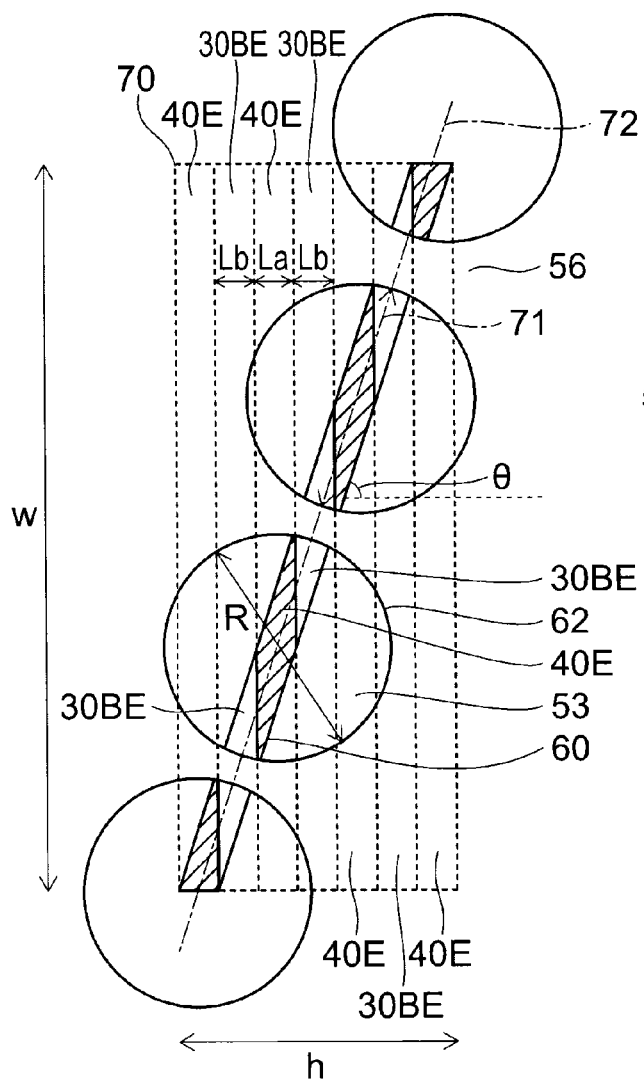
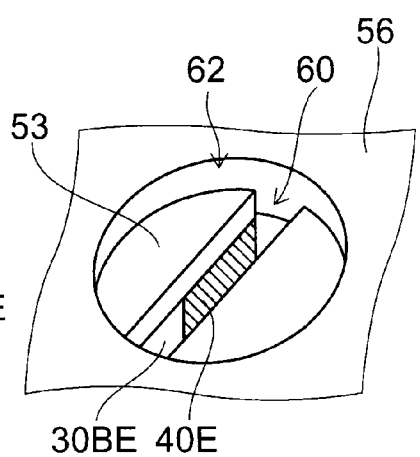
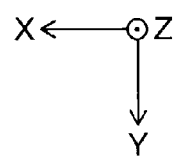

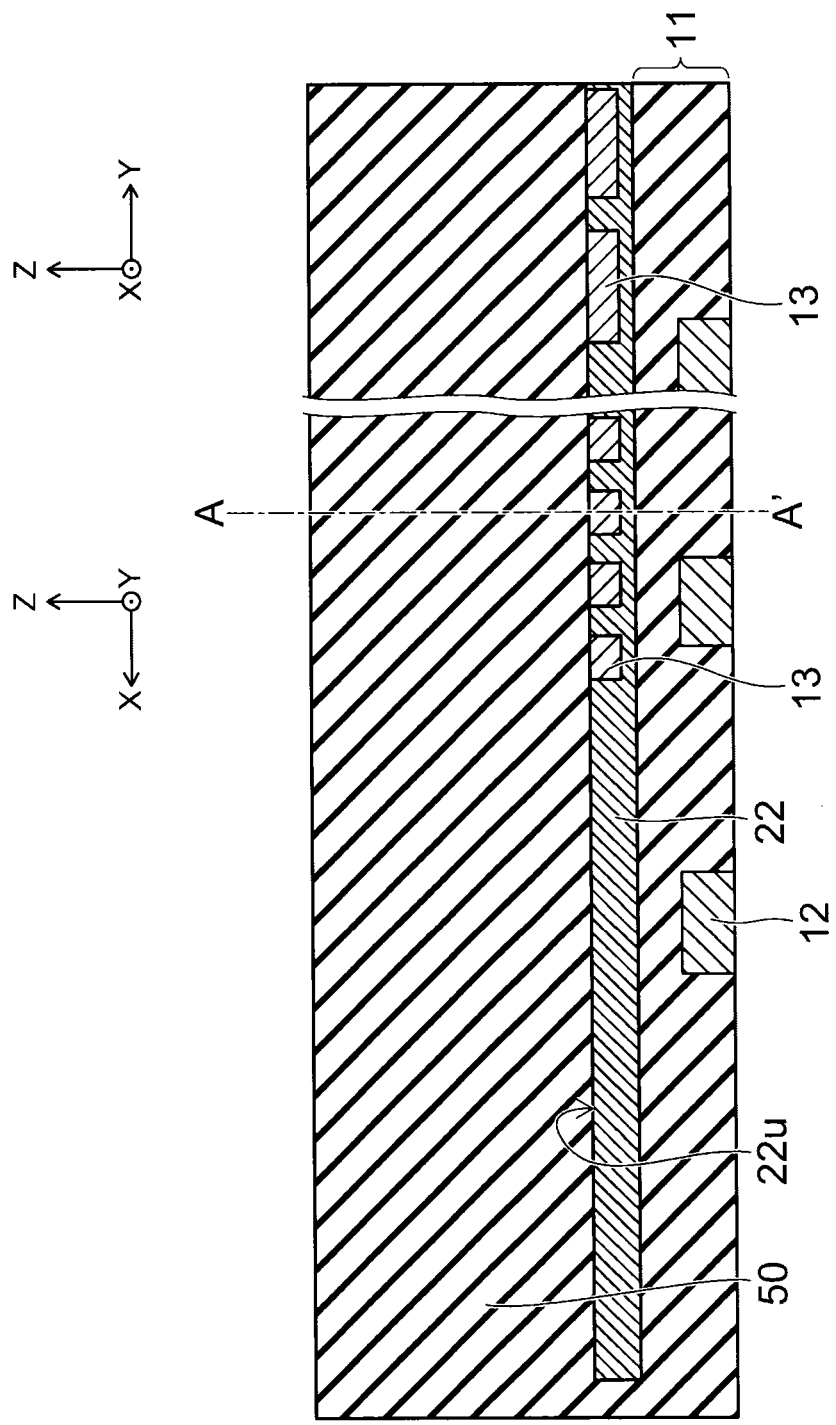

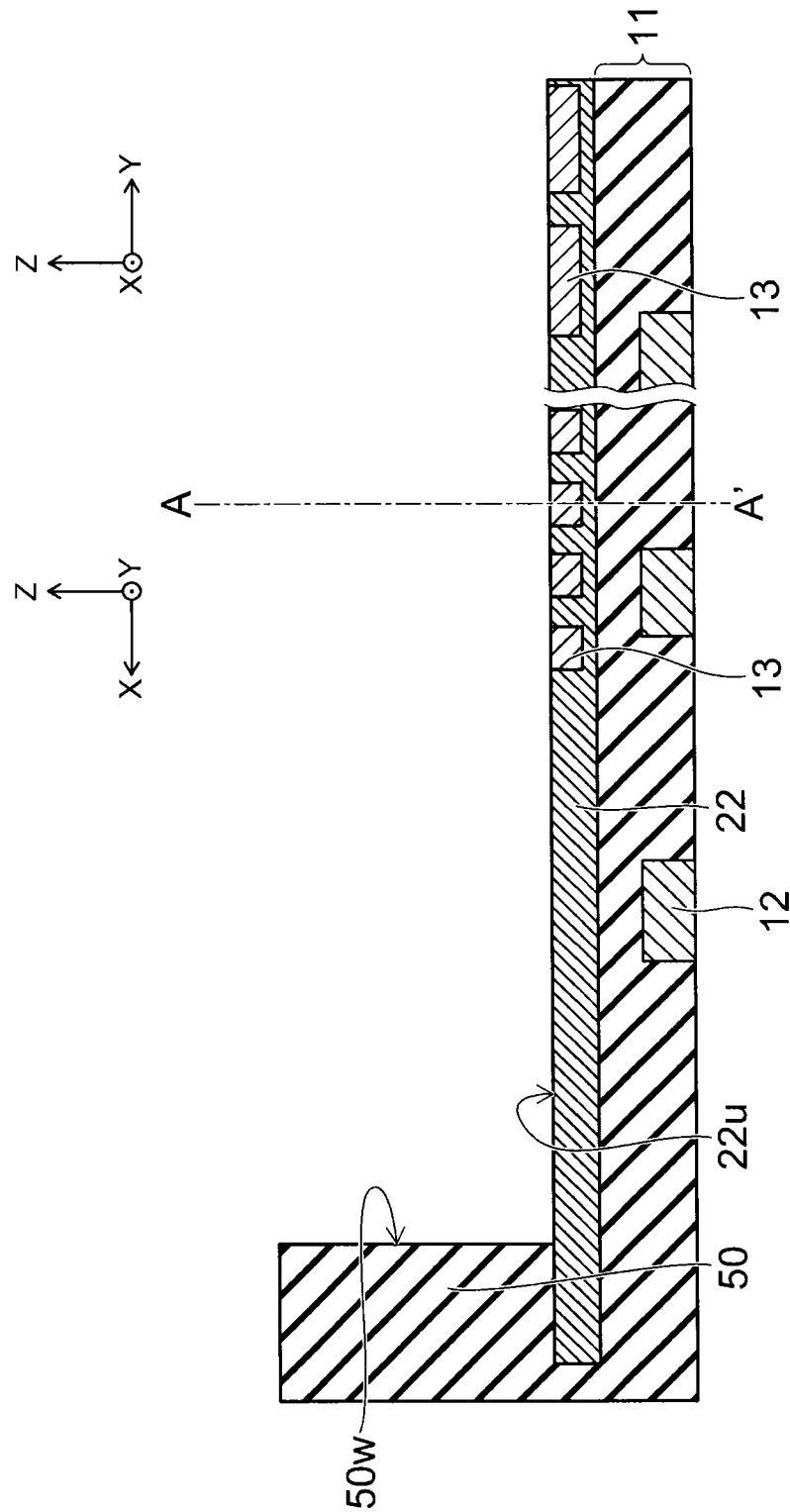

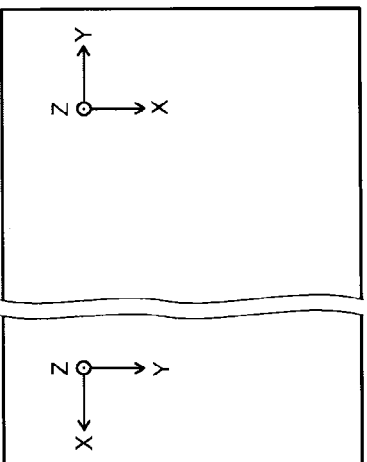
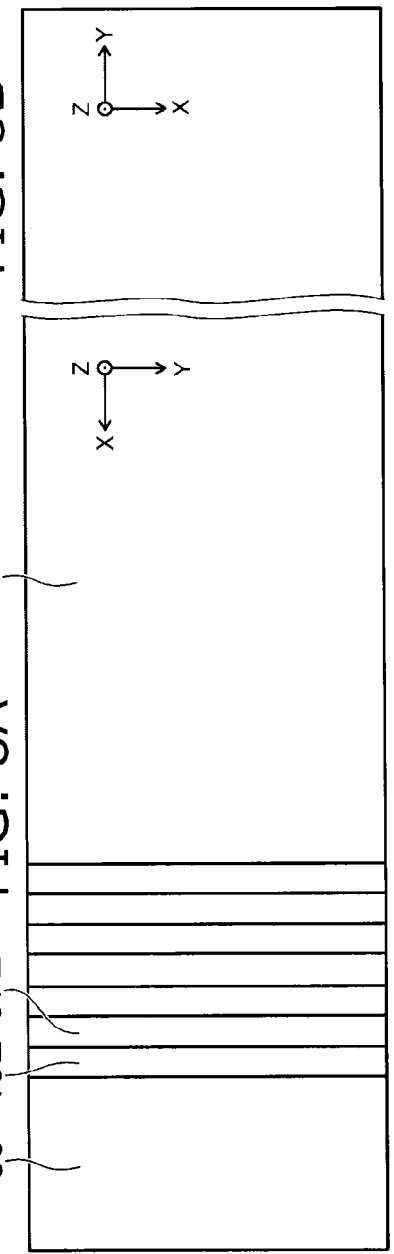
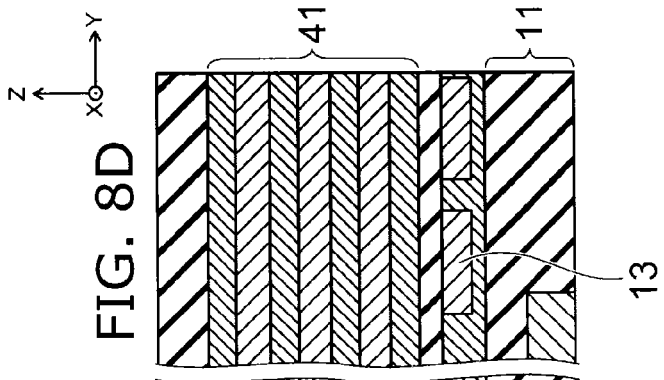
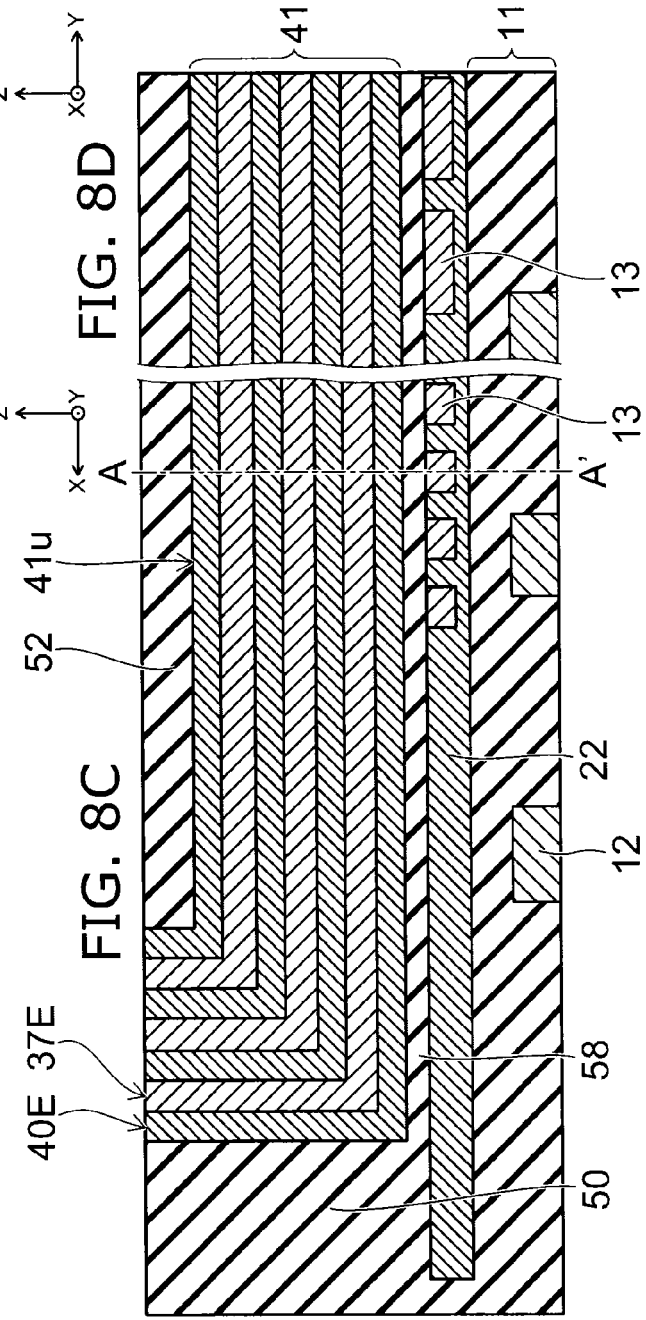

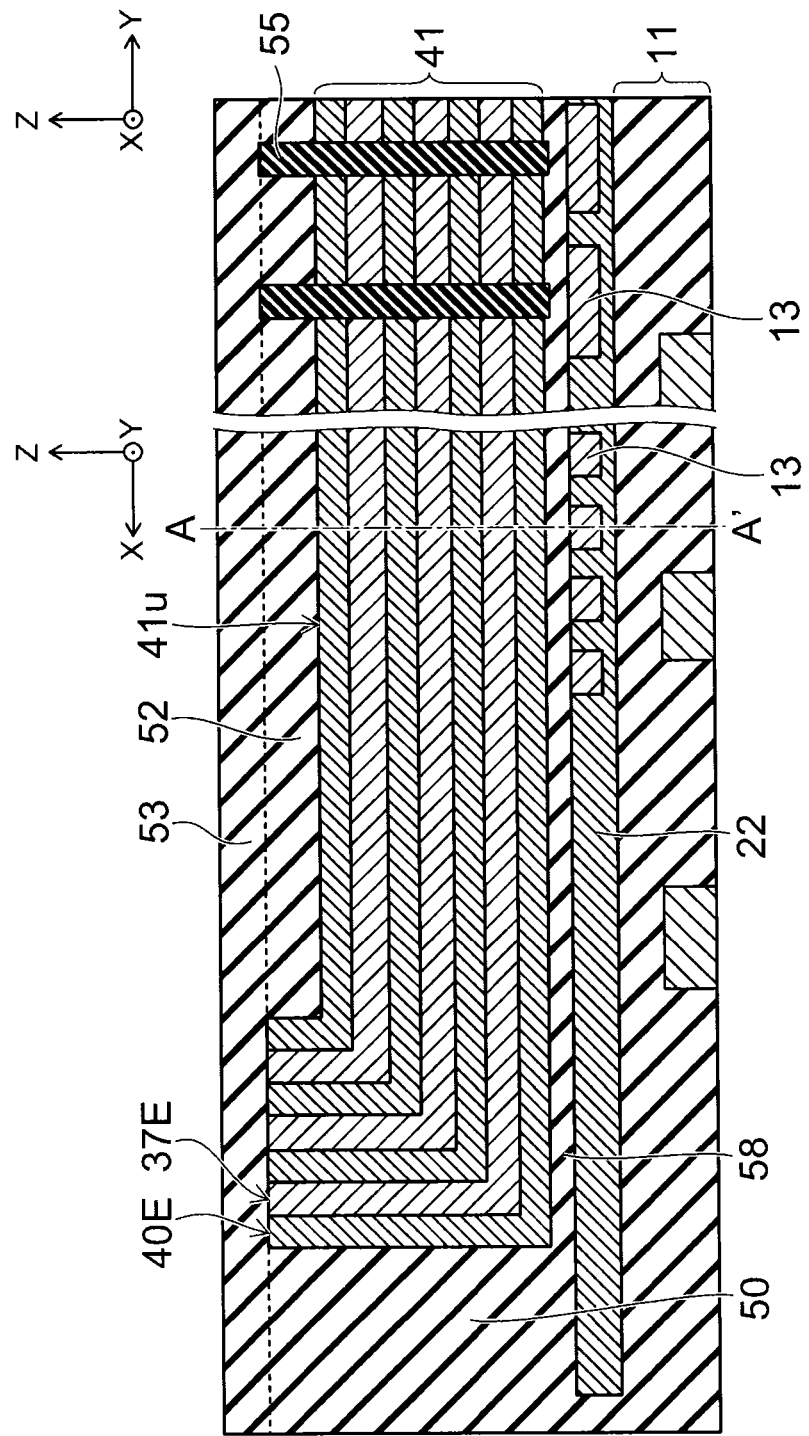

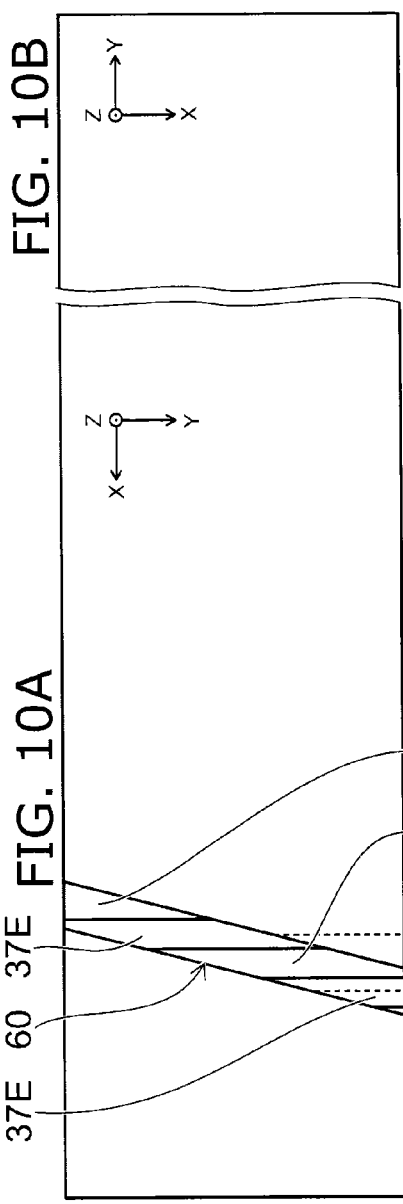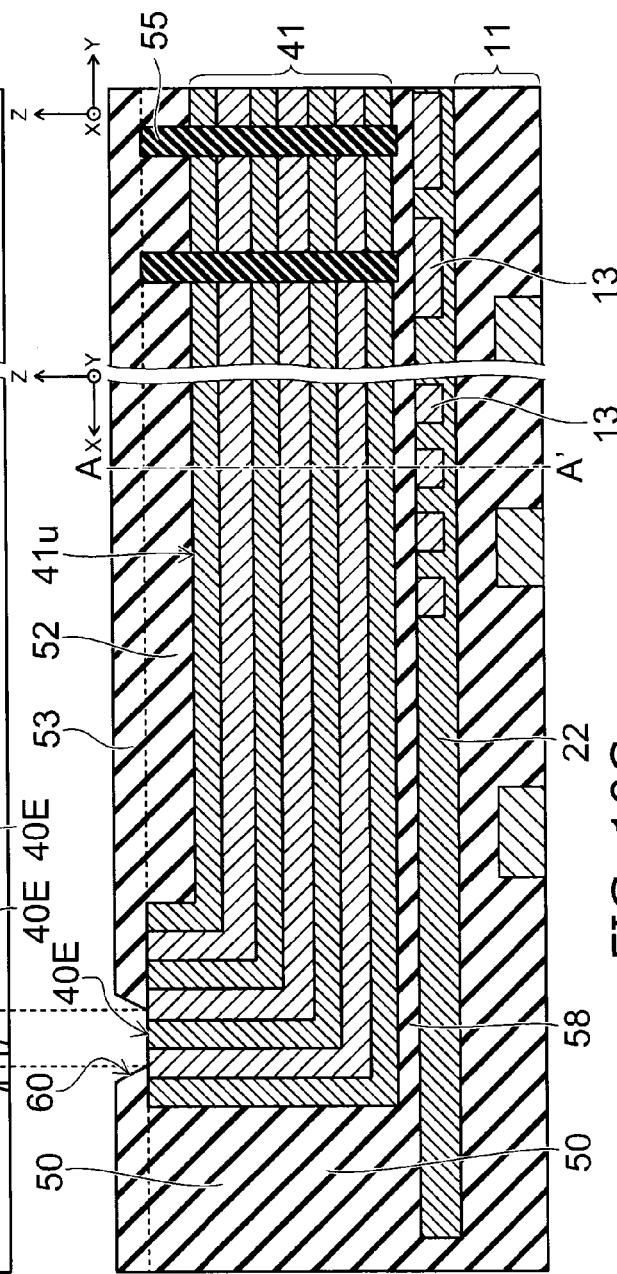
FIG. 10A FIG. 10B FIG. 10C FIG. 10D

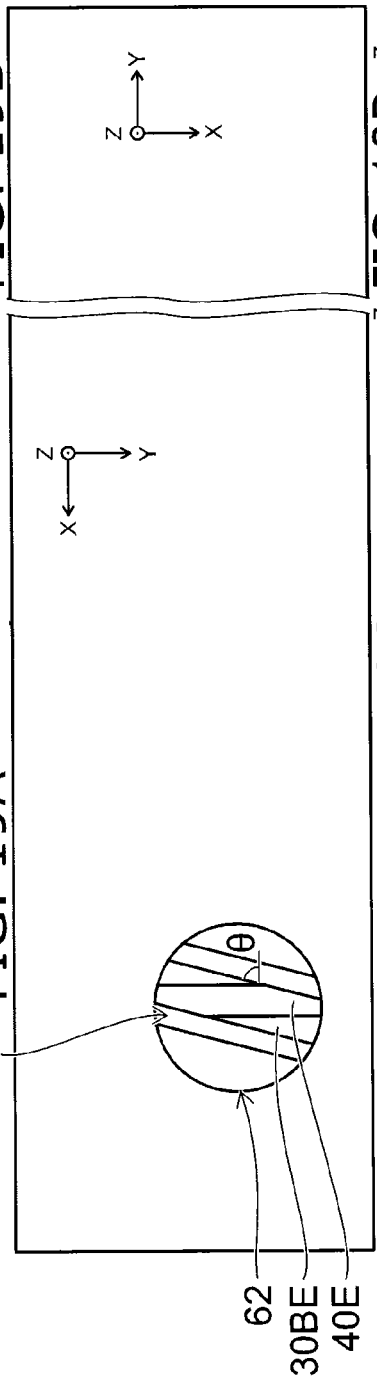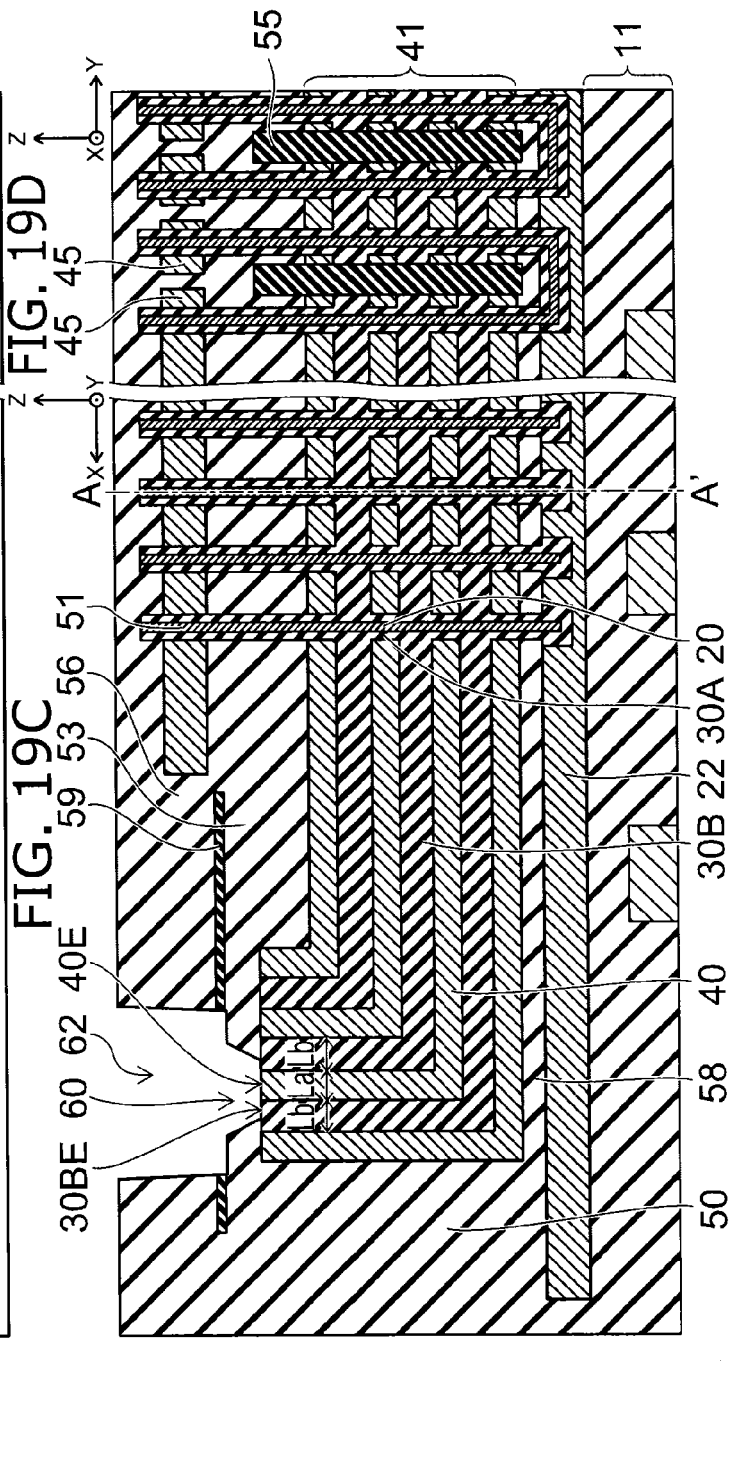

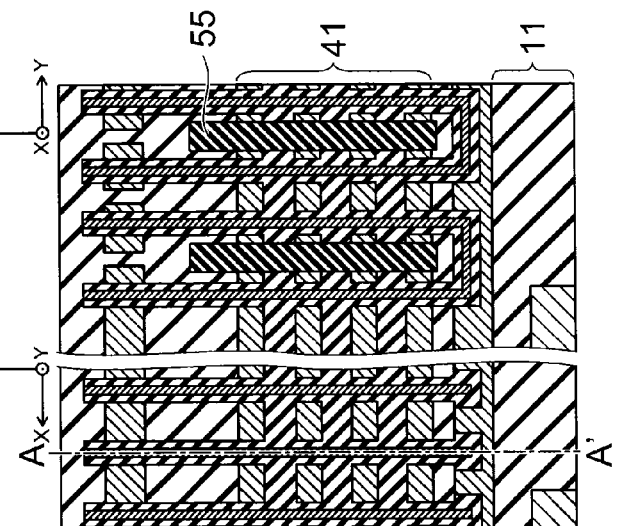
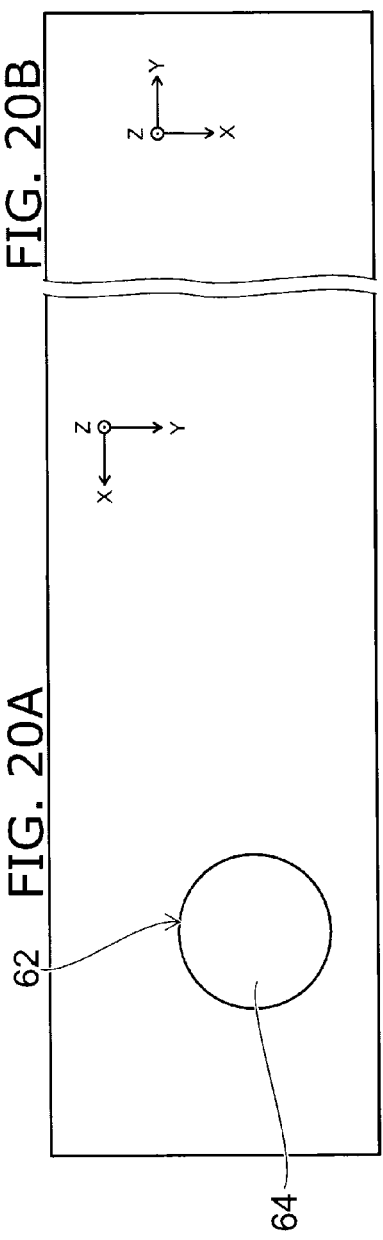
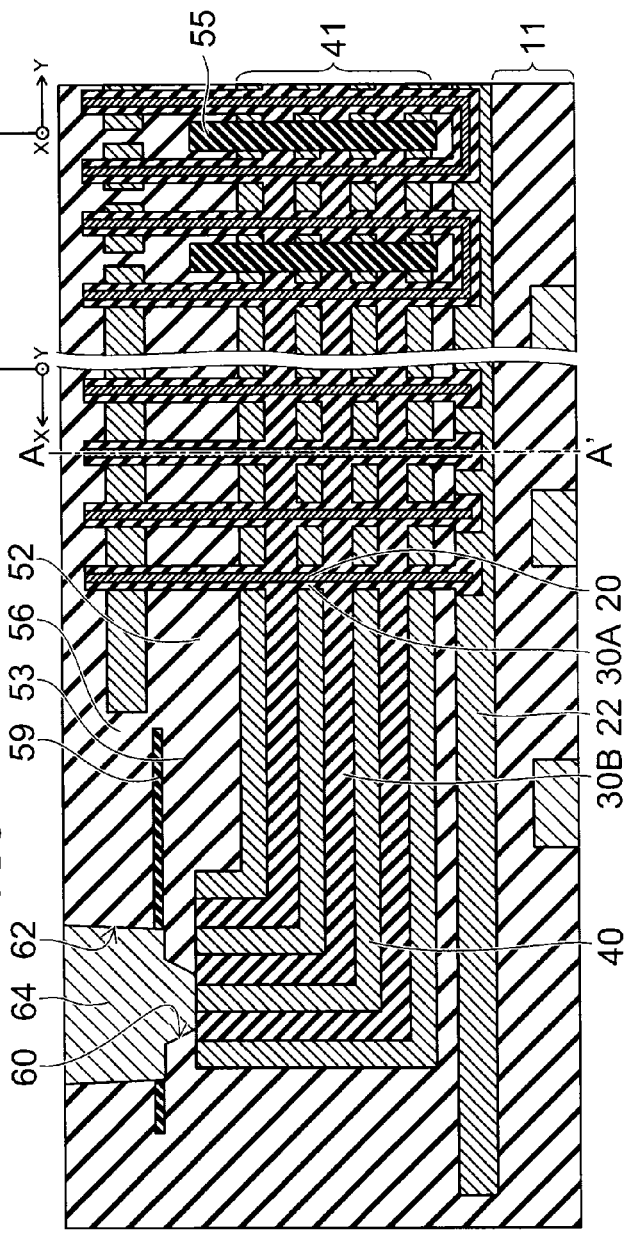

US 8,884,356 B2

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior U.S. Provisional Patent Application 61/697,093, filed on Sep. 5, 2012; the entire contents of which are incorporated herein by reference.

FIELD

Embodiments described herein relate generally to a nonvolatile semiconductor memory device and a method for manufacturing the same

BACKGROUND

A nonvolatile semiconductor memory device as typified by a flash memory is used in various applications. There is demand for further increase in the capacity of such a nonvolatile semiconductor memory device. However, the miniaturization of nonvolatile semiconductor memory devices has advanced. The fact is that the processing thereof has become difficult. For instance, in a structure in which memory cells, circuit elements and the like are arranged in two dimensions, miniaturization processing has become difficult.

In contrast, recently, a nonvolatile semiconductor memory device of a three-dimensional structure has been drawing attention. In this structure, memory cells, select gates and the like are arranged in the direction perpendicular to the substrate. In the three-dimensional structure, the capacity can be increased by increasing the number of stacked layers even if the minimum processing dimension is equal to that of the two-dimensional structure. However, miniaturization still advances also in the nonvolatile semiconductor memory device of the three-dimensional structure. For instance, even if miniaturization advances, good electrical contact is required between the electrode layer in the memory cell and the interconnect connected to this electrode layer.

BRIEF DESCRIPTION OF THE DRAWINGS

FIGS. 4A and 4B are schematic views of the nonvolatile semiconductor memory device according to the first embodiment, FIG. 4A is a schematic plan view of the B-B' cross section of FIG. 3A, and FIG. 4B is a schematic perspective view;

FIGS. 5A and 5B are schematic sectional views describing the process for manufacturing a nonvolatile semiconductor memory device according to the first embodiment;

FIGS. 6A and 6B are schematic sectional views describing the process for manufacturing a nonvolatile semiconductor memory device according to the first embodiment;

FIGS. 8A and 8B are schematic plan views describing the process for manufacturing a nonvolatile semiconductor memory device according to the first embodiment, and FIGS. 8C and 8D are schematic sectional views describing the process for manufacturing a nonvolatile semiconductor memory device according to the first embodiment;

FIGS. 9A and 9B are schematic sectional views describing the process for manufacturing a nonvolatile semiconductor memory device according to the first embodiment;

FIGS. 10A and 10B are schematic plan views describing the process for manufacturing a nonvolatile semiconductor memory device according to the first embodiment, and FIGS. 10C and 10D are schematic sectional views describing the process for manufacturing a nonvolatile semiconductor memory device according to the first embodiment;

FIGS. 19A and 19B are schematic plan views describing the process for manufacturing a nonvolatile semiconductor memory device according to the first embodiment, and FIGS. 19C and 19D are schematic sectional views describing the process for manufacturing a nonvolatile semiconductor memory device according to the first embodiment;

FIGS. 20A and 20B are schematic plan views describing the process for manufacturing a nonvolatile semiconductor memory device according to the first embodiment, and FIGS. 20C and 20D are schematic sectional views describing the process for manufacturing a nonvolatile semiconductor memory device according to the first embodiment;

FIG. 21A is a schematic plan view of the B-B' cross section of FIG. 21B, and FIG. 21B is a schematic sectional view of the A-A' cross section of FIG. 21A;

DETAILED DESCRIPTION

Figure 1:
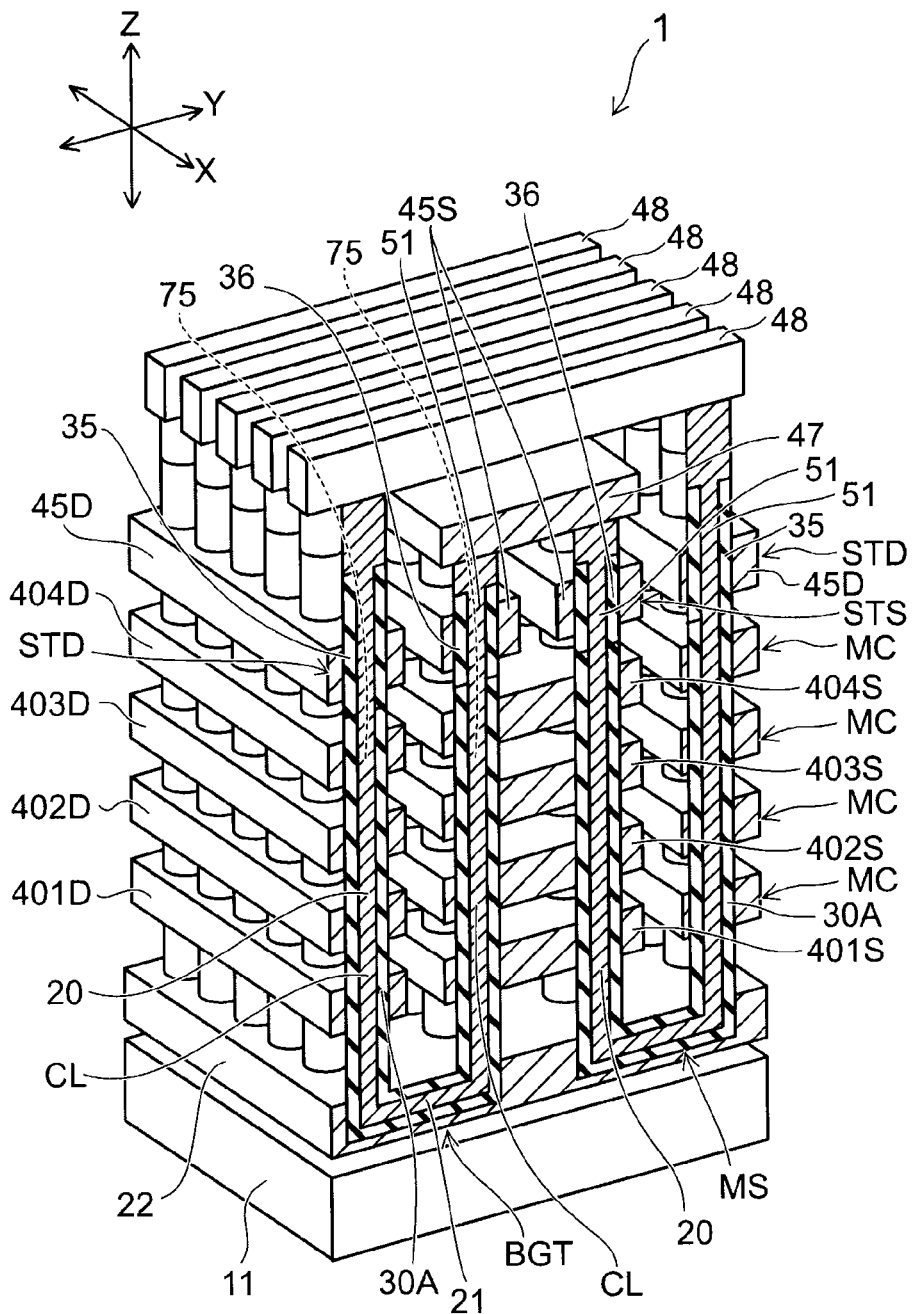
FIG. 1 is a schematic perspective view of a memory cell array section of a nonvolatile semiconductor memory device according to a first embodiment.

In general, according to one embodiment, a nonvolatile semiconductor memory device includes: a foundation layer; a stacked body provided on the foundation layer and including a plurality of electrode layers and a plurality of insulating layers alternately stacked; a plurality of first channel body layers extending from an upper surface of the stacked body through the stacked body to a lower surface of the stacked body; a memory film provided between each of the plurality of first channel body layers and each of the plurality of electrode layers; a first interlayer insulating film provided on the stacked body; a plurality of select gate electrodes provided on the first interlayer insulating film; a second channel body layer penetrating through each of the plurality of select gate electrodes and the first interlayer insulating film, and the second channel body layer being connected to each of the plurality of first channel body layers; and a gate insulating film provided between each of the plurality of select gate electrodes and the second channel body layer.

The stacked body is bent, and each end surface of the plurality of electrode layers and each end surface of the plurality of insulating layers face upward from the foundation layer.

The first interlayer insulating film includes a slit extending in a direction generally parallel to the upper surface of the stacked body, the slit extends in a direction non-parallel to a first direction in which each end surface of the plurality of electrode layers extends.

Part of at least one end surface of the plurality of electrode layers is part of bottom of the slit.

Embodiments will now be described with reference to the drawings. In the following description, like members are labeled with like reference numerals. The description of the members once described is omitted appropriately.

First Embodiment

An overview of memory cells of a nonvolatile semiconductor memory device according to a first embodiment is described.

FIG. 1 is a schematic perspective view of a memory cell array section of the nonvolatile semiconductor memory device according to the first embodiment.

Figure 2:
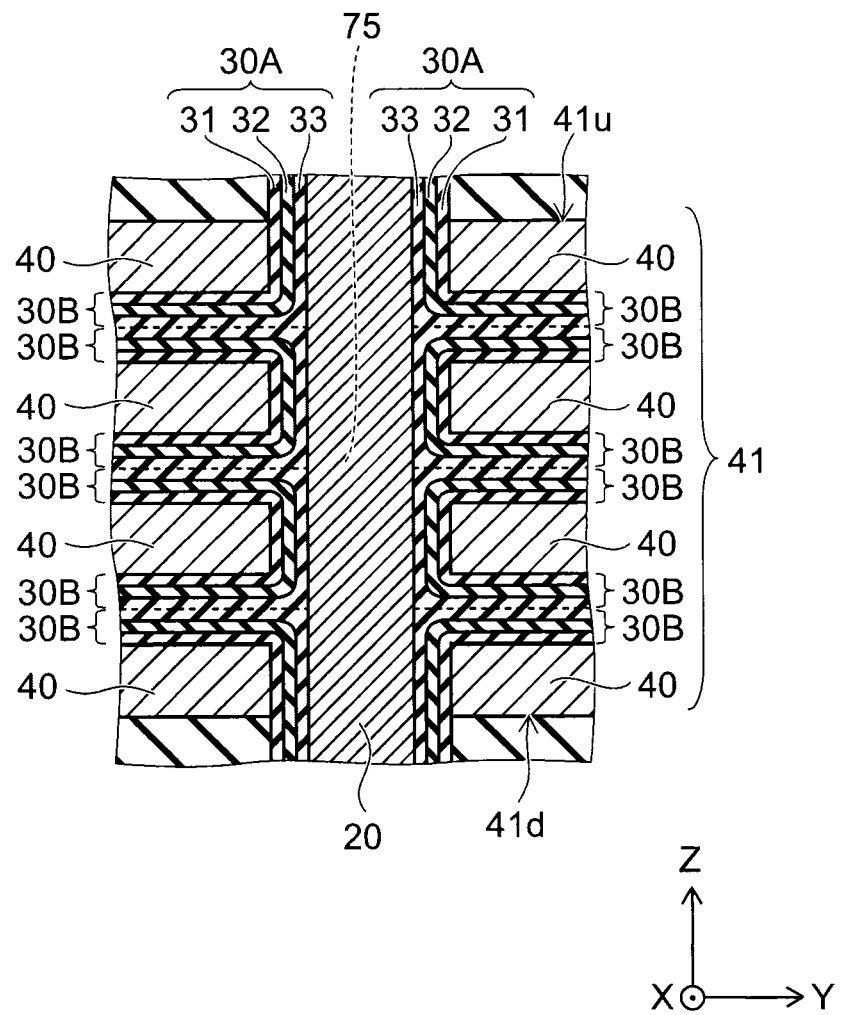
FIG. 2 is an enlarged schematic sectional view of the memory cell section according to the first embodiment.

FIG. 2 is an enlarged schematic sectional view of the memory cell section according to the first embodiment.

In FIG. 1, for clarity of illustration, insulating portions other than the insulating film formed on the inner wall of the memory hole 75 are not shown.

In FIG. 1, for convenience of description, an XYZ orthogonal coordinate system is introduced. In this coordinate system, two directions parallel to the major surface of the foundation layer 11 and orthogonal to each other are referred to as X direction and Y direction. The direction orthogonal to both these X and Y directions is referred to as Z direction.

In the nonvolatile semiconductor memory device 1, on a foundation layer 11, a back gate layer 22 is provided via an insulating layer, not shown. The foundation layer 11 includes e.g. a semiconductor substrate, an insulating layer, and circuits. For instance, in the foundation layer 11, active elements such as transistors, and passive elements such as resistors and capacitors are provided. The back gate layer 22 is e.g. a silicon (Si) layer doped with an impurity element.

On the back gate layer 22, a plurality of insulating layers 30B (see FIG. 2), electrode layers 401D, 402D, 403D, 404D on the drain side, and electrode layers 401S, 402S, 403S, 404S on the source side are alternately stacked.

The electrode layer 401D and the electrode layer 401S are provided at the same level and represent first lowest electrode layers. The electrode layer 402D and the electrode layer 402S are provided at the same level and represent second lowest electrode layers. The electrode layer 403D and the electrode layer 403S are provided at the same level and represent third lowest electrode layers. The electrode layer 404D and the electrode layer 404S are provided at the same level and represent fourth lowest electrode layers.

The electrode layer 401D and the electrode layer 401S are divided in the Y direction. The electrode layer 402D and the electrode layer 402S are divided in the Y direction. The electrode layer 403D and the electrode layer 403S are divided in the Y direction. The electrode layer 404D and the electrode layer 404S are divided in the Y direction.

An insulating layer, not shown, is provided between the electrode layer 401D and the electrode layer 401S, between the electrode layer 402D and the electrode layer 402S, between the electrode layer 403D and the electrode layer 403S, and between the electrode layer 404D and the electrode layer 404S.

The electrode layers 401D, 402D, 403D, 404D are provided between the back gate layer 22 and a drain side select gate electrode 45D. The electrode layers 401S, 402S, 403S, 404S are provided between the back gate layer 22 and a source side select gate electrode 45S.

In the following description, the electrode layers 401D, 402D, 403D, 404D, 401S, 402S, 403S, 404S may also be collectively and simply referred to as electrode layers 40. The number of electrode layers 40 is arbitrary, and not limited to four layers illustrated in the first embodiment.

The electrode layer 40 is e.g. a silicon layer doped with an impurity element such as boron (B) and having conductivity.

In the first embodiment, as the insulating layer 30B, an insulating layer of an ONO structure is illustrated (described later).

On the electrode layer 404D, a drain side select gate electrode 45D is provided via an insulating layer, not shown. The drain side select gate electrode 45D is e.g. a silicon layer doped with impurity and having conductivity.

On the electrode layer 404S, a source side select gate electrode 45S is provided via an insulating layer, not shown. The source side select gate electrode 45S is e.g. a silicon layer doped with impurity and having conductivity.

The drain side select gate electrode 45D and the source side select gate electrode 45S are divided in the Y direction. The drain side select gate electrode 45D and the source side select gate electrode 45S may also be simply referred to as select gate electrode 45 without distinction.

On the source side select gate electrode 45S, a source line 47 is provided via an insulating layer, not shown. The source line 47 is connected to a channel body layer 51 connected to one of a pair of channel body layers 20. The source line 47 is a metal layer, or a silicon layer doped with impurity and having conductivity.

On the drain side select gate electrode 45D and the source line 47, a plurality of bit lines 48 are provided via an insulating layer, not shown. The bit line 48 is connected to a channel body layer 51 connected to the other of the pair of channel body layers 20. Each bit line 48 extends in the Y direction.

In the back gate layer 22 and the stacked body 41 on this back gate layer 22, a plurality of U-shaped memory holes 75 are formed. For instance, in the electrode layers 401D-404D and the drain side select gate electrode 45D, holes extending therethrough in the Z direction are formed. In the electrode layers 401S-404S and the source side select gate electrode 45S, holes extending therethrough in the Z direction are formed. A pair of the holes extending in the Z direction are linked via a recess (space portion) formed in the back gate layer 22 to constitute a U-shaped memory hole 75. Besides the U-shaped memory hole, this embodiment also includes a straight memory hole (described later).

Inside the memory hole 75, a channel body layer 20 (first channel body layer) is provided in a U-shape. The channel body layer 20 is e.g. a silicon layer. A memory film 30A is provided between the channel body layer 20 and the inner wall of the memory hole 75.

A gate insulating film 35 is provided between the channel body layer 51 (second channel body layer) connected to the channel body layer 20 and the drain side select gate electrode 45D. The channel body layer 51 is e.g. a silicon layer. A gate insulating film 36 is provided between the channel body layer 51 and the source side select gate electrode 45S.

Here, the embodiment is not limited to the structure in which the inside of the memory hole 75 is entirely filled with the channel body layer 20. As an alternative structure, the channel body layer 20 may be formed so as to leave a void portion on the central axis side of the memory hole 75, and the inside void portion may be filled with insulator.

The memory film 30A has e.g. an ONO (oxide-nitride-oxide) structure in which a silicon nitride film is sandwiched between a pair of silicon oxide films. As shown in FIG. 2, between each electrode layer 40 and the channel body layer 20, sequentially from the electrode layer 40 side, an insulating film 31, a charge accumulation film 32, and an insulating film 33 are provided. The insulating film 31 is in contact with the electrode layer 40. The insulating film 33 is in contact with the channel body layer 20. The charge accumulation film 32 is provided between the insulating film 31 and the insulating film 33. Here, between the electrode layers 40, two insulating layers 30B are provided. The insulating film 31 is e.g. a silicon oxide film. The charge accumulation film 32 is e.g. a silicon nitride film. The insulating film 33 is e.g. a silicon oxide film.

The channel body layer 20 functions as a channel in a transistor constituting a memory cell. The electrode layer 40 functions as a control gate. The charge accumulation film 32 functions as a data memory layer for accumulating charge injected from the channel body layer 20. That is, at the intersection of the channel body layer 20 and each electrode layer 40, a memory cell MC having a structure with the channel surrounded with the control gate is formed.

The nonvolatile semiconductor memory device 1 of the first embodiment is a nonvolatile semiconductor memory device capable of electrically and freely erasing/writing data and retaining its memory content even when powered off.

The drain side select gate electrode 45D, the channel body layer 20, and the gate insulating film 35 therebetween constitute a drain side select transistor STD. The channel body layer 20 above the drain side select transistor STD is connected to a bit line 48.

The source side select gate electrode 45S, the channel body layer 51, and the gate insulating film 36 therebetween constitute a source side select transistor STS. The channel body layer 51 above the source side select transistor STS is connected to a source line 47.

The back gate layer 22, the channel body layer 20 provided in this back gate layer 22, and the memory film 30A constitute a back gate layer transistor BGT.

A plurality of memory cells MC with the electrode layers 404D-401D serving as control gates are provided between the drain side select transistor STD and the back gate layer transistor BGT. Similarly, a plurality of memory cells MC with the electrode layers 401S-404S serving as control gates are provided between the back gate layer transistor BGT and the source side select transistor STS.

The plurality of memory cells MC, the drain side select transistor STD, the back gate layer transistor BGT, and the source side select transistor STS are series connected via the channel body layer to constitute one U-shaped memory string MS.

One memory string MS includes a pair of columnar portions CL extending in the stacking direction of the stacked body 41 including a plurality of electrode layers 40, and a linking portion 21 embedded in the back gate layer 22 and linking the pair of columnar portions CL. A plurality of such memory strings MS are arranged in the X direction and the Y direction. Thus, a plurality of memory cells are provided three-dimensionally in the X direction, the Y direction, and the Z direction.

The plurality of memory strings MS are provided on a memory cell array region in the foundation layer 11. Around the periphery, for instance, of the memory cell array region in the foundation layer 11, a peripheral circuit for controlling the memory cell array is provided.

Figures 3A, 3B:
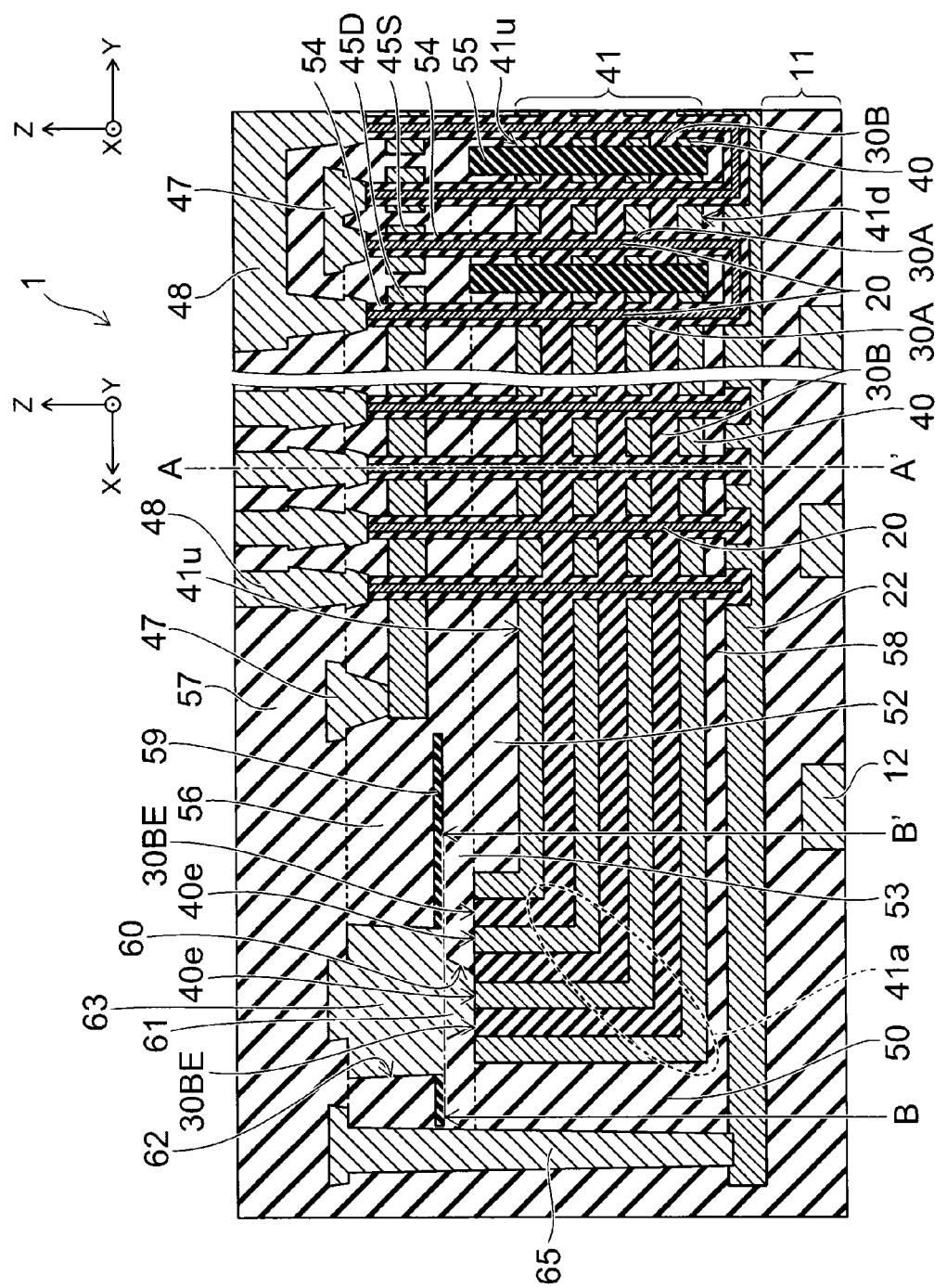
FIGS. 3A and 3B are schematic sectional views of the nonvolatile semiconductor memory device according to the first embodiment.

FIGS. 3A and 3B are schematic sectional views of the nonvolatile semiconductor memory device according to the first embodiment. Here, FIG. 3B is a schematic sectional view taken along line A-A' of FIG. 3A.

In the nonvolatile semiconductor memory device 1 according to the first embodiment, a stacked body 41 with a plurality of electrode layers 40 and a plurality of insulating layers 30B alternately stacked therein is provided on a foundation layer 11 including a interconnect layer 12. A pair of channel body layers 20 (first channel body layers) penetrate through the stacked body 41. The pair of channel body layers 20 extend from the upper surface 41u of the stacked body 41 to the lower surface 41d of the stacked body 41. An insulating layer 55 is provided between the pair of channel body layers 20. The stacked body 41 is covered with insulating layers 50, 52, 58.

A memory film 30A is provided between each of the pair of first channel body layers 20 and each of the plurality of electrode layers 40. An insulating layer 52 and an interlayer insulating film 53 (first interlayer insulating film) are provided on the stacked body 41. A pair of select gate electrodes 45D, 45S are provided on the interlayer insulating film 53.

A channel body layer 51 (second channel body layer) is connected to each of the pair of first channel body layers 20. The channel body layer 51 penetrates through each of the pair of select gate electrodes 45D, 45S, the interlayer insulating film 53, and the insulating layer 52. A gate insulating film 54 is provided between each of the pair of select gate electrodes 45D, 45S and the channel body layer 51.

The stacked body 41 is bent so that each end surface 40E of the plurality of electrode layers 40 and each end surface 30BE of the plurality of insulating layers 30B face upward from the foundation layer 11. Specifically, the stacked body 41 is bent so that each end surface of the plurality of electrode layers 40 and each end surface 30BE of the plurality of insulating layers 30B are generally parallel to the upper surface 41u of the stacked body 41. For instance, the stacked body 41 extends in a direction (X direction) generally parallel to the arranging direction (Y direction) of the pair of first channel body layers 20, and a portion thereof (the portion 41a in the figure) is bent at a generally right angle.

If the conductive layer 63 described later is removed, at least one of the plurality of electrode layers 40 is exposed at the bottom of the slit 60. The electrode layer 40 exposed from the interlayer insulating film 53 is connected to a conductive layer 61 provided in the slit 60. Furthermore, an interlayer insulating film 56 (second interlayer insulating film) is provided on the interlayer insulating film 53. A contact hole 62 is provided in the interlayer insulating film 56. The slit 60 is exposed at the bottom of the contact hole 62. The conductive layer 61 is connected to a conductive layer 63 provided in the contact hole 62.

The conductive layer 61 and the conductive layer 63 may be composed of either the same material or different materials. The material of the conductive layers 61, 63 is e.g. W or AlCu. The conductive layer 61 and the conductive layer 63 are collectively referred to as conductive layer 64. In addition, a stopper film 59 composed of an insulating material is provided between the interlayer insulating film 53 and the interlayer insulating film 56. A interconnect layer 65 is connected to the back gate layer 22. Furthermore, an insulating layer 57 is provided on the interlayer insulating film 56.

FIGS. 4A and 4B are schematic views of the nonvolatile semiconductor memory device according to the first embodiment. FIG. 4A is a schematic plan view of the B-B' cross section of FIG. 3A. FIG. 4B is a schematic perspective view.

FIGS. 4A and 4B show a state in which the conductive layer 64 is removed in order to describe the structure of the slit 60 and the contact hole 62.

In the first embodiment, part of at least one end surface 40E of the plurality of electrode layers 40 is exposed at the bottom of the slit 60. In other words, part of the end surface 40E constitutes part of the bottom of the slit 60. For instance, by providing a plurality of slits 60, part of each of two or more end surfaces 40E is opened from the interlayer insulating film 53. As viewed in the direction perpendicular to the Z direction, the plurality of slits 60 are arranged on the same line 72 (first line). Furthermore, a plurality of contact holes 62 are provided in the interlayer insulating film 56. The slit 60 is exposed at each bottom of the plurality of contact holes 62. In other words, the slit 60 is connected to the contact hole 62 at the bottom of the contact hole 62. That is, part of at least one end surface 40E of the plurality of electrode layers 40 is exposed from the interlayer insulating film by the slit 60 and the contact hole 62 formed therein.

Here, the slit 60 extends in a direction generally parallel to the upper surface 41u of the stacked body 41 and the slit 60 extends in a direction non-parallel to a first direction (e.g., Y direction) in which each end surface 40E of the plurality of electrode layers 40 extends.

For instance, a plurality of striped patterns formed by the end surfaces 40E of the plurality of electrode layers 40 are referred to as a plurality of first line patterns. A plurality of striped patterns formed by the end surfaces 30BE of the plurality of insulating layers 30B are referred to as a plurality of second line patterns. The end portion of the slit 60 is located on the first line pattern and on the second line pattern adjacent to the first line pattern. Furthermore, the length of a first side in the first direction (e.g., Y direction) of the rectangular region 70 made of the plurality of first line patterns and the plurality of second line patterns is denoted by "w". The length of a second side of the rectangular region 70 in the direction in which the plurality of first line patterns and the plurality of second line patterns are alternately arranged is denoted by "h".

If the angle θ between the second side and the slit 60 is in the range of 0°<θ<180°, the slit and the first pattern are made non-parallel (except)θ=90°. If θ=tan$^{-1}$(w/h), the slit 60 is provided on the diagonal of the rectangular region 70.

The line width of the first line pattern is denoted by "La", and the line width of the second line pattern is denoted by "Lb". Then, the inner diameter R of the contact hole 62 is larger than or equal to La+2×Lb. Here, the line width of a line pattern refers to the width of the line pattern in the direction perpendicular to the extending direction of the line pattern. The inner diameter R refers to the inner diameter at the lower end of the contact hole 62. For instance, the inner diameter R is defined as the inner diameter at the position of the boundary between the interlayer insulating film 53 and the interlayer insulating film 56 in the figure. The inner diameter R of the contact hole is equal to the central axis 71 of the slit between both ends of each slit 60. The line width of the slit 60 only needs to be approximately equal to the line width of the first line pattern. The slit 60 does not need to be arranged on the diagonal of the rectangular region 70. The shape of the contact hole 62 does not need to be circular.

A process for manufacturing a nonvolatile semiconductor memory device according to the first embodiment is now described.

FIGS. 5A to 7B, 9A, 9B, and 11A to 18B are schematic sectional views describing the process for manufacturing a nonvolatile semiconductor memory device according to the first embodiment. Here, the figure with the suffix B shows a cross section taken along line A-A' of the corresponding figure with the suffix A.

FIGS. 8A to 8D, 10A to 10D, 19A to 19D, and 20A to 20D are schematic plan views and schematic sectional views describing the process for manufacturing a nonvolatile semiconductor memory device according to the first embodiment. Here, the figure with the suffix D shows a cross section taken along line A-A' of the corresponding figure with the suffix C. The figures with the suffixes A and B show the top surface of the corresponding figure with the suffixes C and D, respectively.

First, as shown in FIGS. 5A and 5B, a back gate layer 22 (first semiconductor layer) is formed on a foundation layer 11. The foundation layer 11 includes device elements for controlling memory cells and a substrate for supporting device elements and the like. The back gate layer 22 is e.g. a boron-doped polysilicon layer or a boron-doped amorphous silicon layer.

Then, a sacrificial layer 13 (first sacrificial layer) having a bottom surface and a side surface is embedded in the back gate layer 22. For instance, the sacrificial layer 13 is formed so that the bottom surface and the side surface of the sacrificial layer 13 are surrounded with the back gate layer 22. The sacrificial layer 13 is provided to form a trench for linking the lower ends of a pair of memory holes (described later). The sacrificial layer 13 is formed by photolithography, etching, film formation technology and the like. The material of the sacrificial layer 13 is e.g. non-doped polysilicon. Then, an insulating layer 50 (first insulating layer) is formed on the back gate layer 22 and on the sacrificial layer 13.

Next, as shown in FIGS. 6A and 6B, by removing part of the insulating layer 50, the sacrificial layer 13 and part of the back gate layer 22 ranging with the sacrificial layer 13 are exposed from the insulating layer 50. The removal of part of the insulating layer 50 is performed by anisotropic etching such as RIE (reactive ion etching). The etching results in the state in which the sidewall 50w of the insulating layer 50 and the upper surface 22u of the back gate layer 22 are generally orthogonal.

Figures 7A, 7B:
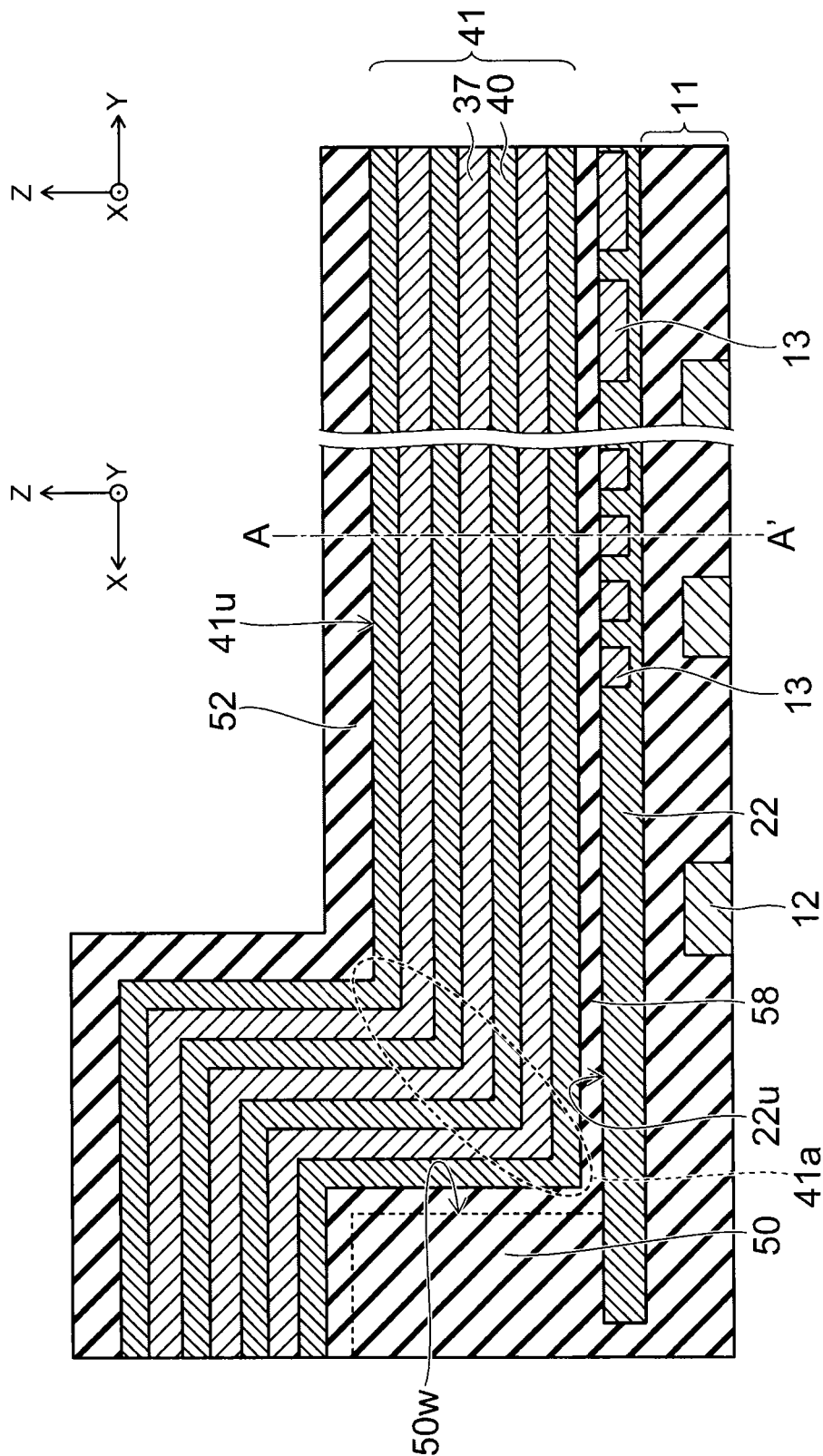
FIGS. 7A and 7B are schematic sectional views describing the process for manufacturing a nonvolatile semiconductor memory device according to the first embodiment.

Next, as shown in FIGS. 7A and 7B, the insulating layer 50, the sacrificial layer 13, and the back gate layer 22 are covered with an insulating layer 58 (second insulating layer). Then, on the insulating layer 58, a stacked body 41 with a plurality of electrode layers 40 and a plurality of sacrificial layers 37 (second sacrificial layers) alternately stacked therein is formed. The material of the electrode layer 40 is e.g. boron-doped polysilicon. The material of the sacrificial layer 37 is e.g. non-doped polysilicon.

Furthermore, this stacked body 41 is covered with an insulating layer 52 (third insulating layer). The thickness of the insulating layer 58 is adjusted to a thickness such that the breakdown voltage between the lowermost electrode layer 40 and the back gate layer 22 can be maintained.

At the stage shown in FIGS. 6A and 6B, the sidewall 50w of the insulating layer 50 and the upper surface 22u of the back gate layer 22 are generally orthogonal. The stacked body 41 is formed on the sidewall 50w of the insulating layer 50 and on the upper surface 22u of the back gate layer 22. Thus, in the stacked body 41, a portion 41a bent at a generally right angle is formed. That is, the insulating layer 50 shown in FIGS. 6A and 6B functions as a pillar for bending the stacked body 41. Then, the stacked body 41 and the insulating layer 52 formed above the height of the upper surface of the insulating layer 50 are removed. This state is shown in FIGS. 8A to 8D.

As shown in FIGS. 8A to 8D, the stacked body 41 is formed on the back gate layer 22. The stacked body 41 is bent so that each end surface 40E of the plurality of electrode layers 40 and each end surface 37E of the plurality of sacrificial layers 37 face upward from the foundation layer 11. For instance, in the stacked body 41 formed, the stacked body 41 is bent so that each end surface 40E of the plurality of electrode layers 40 and each end surface 37E of the plurality of sacrificial layers 37 are generally parallel to the upper surface 41u of the stacked body 41.

The means for removing the stacked body 41 and the insulating layer 52 is e.g. CMP (chemical mechanical polishing). By CMP, the upper surface of the insulating layer 50, the end surfaces 40E of the plurality of electrode layers 40, the end surfaces 37E of the plurality of sacrificial layers 37, and the upper surface of the insulating layer 52 are made flush.

Next, as shown in FIGS. 9A and 9B, an insulating layer 55 extending in the X direction is formed in the stacked body 41 on the center portion of the plurality of sacrificial layers 37. The insulating layer 55 is formed by photolithography, etching, film formation technology and the like. The material of the insulating layer 55 is e.g. silicon nitride. Thus, the stacked body 41 is divided into a plurality by the insulating layer 55 in the Y direction. Then, the insulating layer 50, the end surfaces 40E of the plurality of electrode layers 40, the end surfaces 37E of the plurality of sacrificial layers 37, and the insulating layer 52 are covered with an interlayer insulating film 53 (first interlayer insulating film).

Next, as shown in FIGS. 10A to 10D, a slit 60 is formed in the interlayer insulating film 53 on the end surfaces 40E of the plurality of electrode layers 40. The slit 60 formed at this stage is a slit in which a plurality of slits 60 illustrated in FIGS. 4A and 4B are connected in a line. For instance, the slit 60 is formed in the interlayer insulating film 53 so as to extend in a direction generally parallel to the upper surface 41u of the stacked body 41 and non-parallel to the first direction (e.g., Y direction) in which each end surface 40E of the plurality of electrode layers 40 extends. The slit 60 is formed by e.g. photolithography and etching. Thus, part of at least one end surface 40E of the plurality of electrode layers 40 is exposed from the interlayer insulating film 53. That is, part of at least one end surface 40E of the plurality of electrode layers 40 is exposed at the bottom of the slit 60. At this stage, the slit 60 is provided on the diagonal of the aforementioned rectangular region 70. Thus, by one slit 60, the end surfaces 40E of all the electrode layers 40 in the rectangular region 70 are exposed from the interlayer insulating film 53.

Figures 11A, 11B:
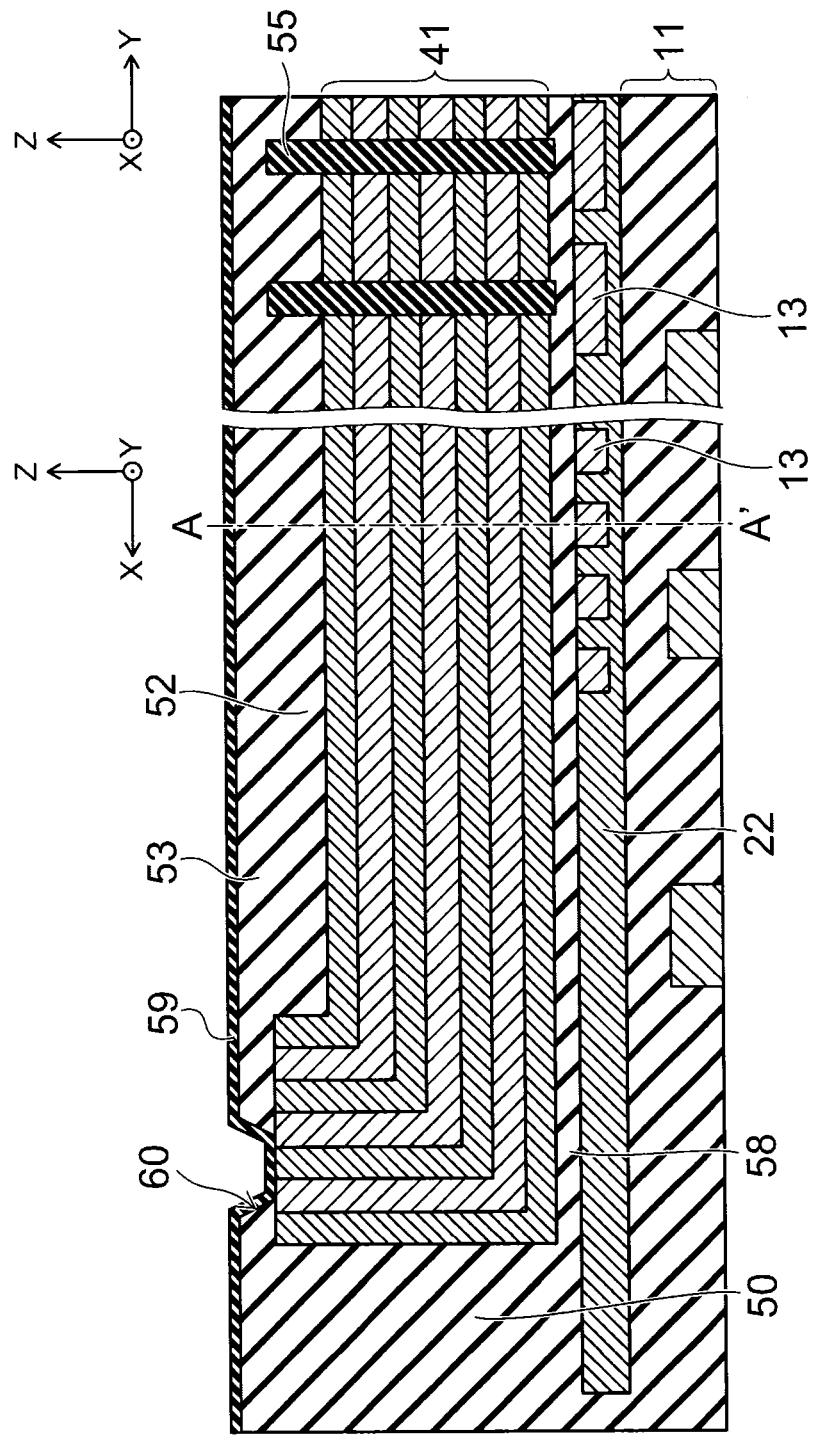
FIGS. 11A to 11B are schematic sectional views describing the process for manufacturing a nonvolatile semiconductor memory device according to the first embodiment.

Next, as shown in FIGS. 11A and 11B, a stopper film 59 is formed on the inner wall of the slit 60, on the end surface 40E of the electrode layer 40 exposed from the interlayer insulating film 53 by the slit 60 provided therein, and on the interlayer insulating film 53. The material of the stopper film 59 is e.g. silicon nitride. Then, the stopper film 59 above the sacrificial layer 13 is removed, whereas the stopper film 59 on the end surface 40E is left. This state is shown in FIGS. 12A and 12B.

Figures 12A, 12B:
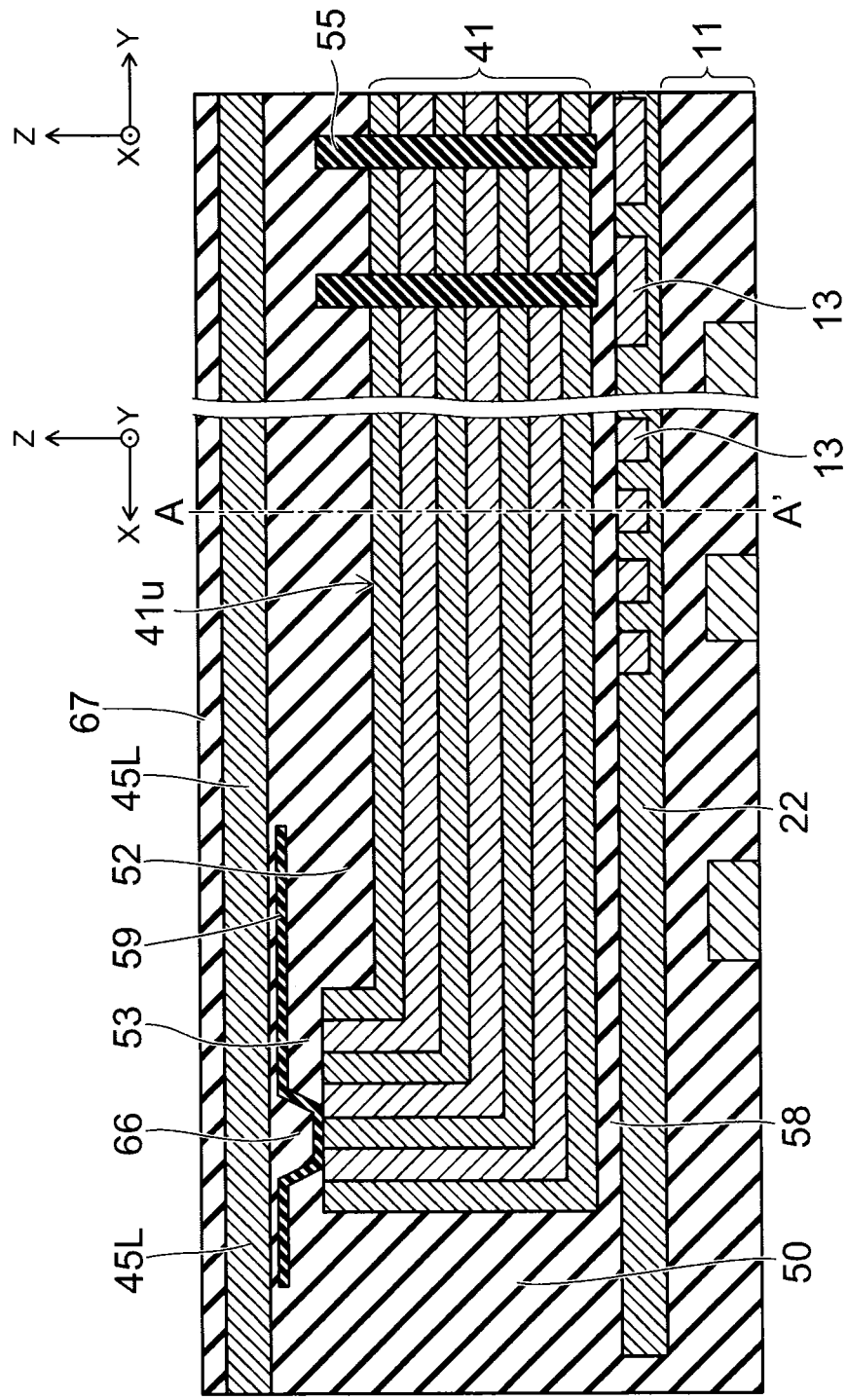
FIGS. 12A to 12B are schematic sectional views describing the process for manufacturing a nonvolatile semiconductor memory device according to the first embodiment.

As shown in FIGS. 12A and 12B, part of the stopper film 59 is removed. Then, an insulating layer 66 (fourth insulating layer) is embedded in the slit 60 via the stopper film 59, and formed on the stopper film 59 outside the slit 60 and on the interlayer insulating film 53.

Here, suppose the case where the stopper film 59 is not provided. If the stopper film 59 is not provided, then in the case where the insulating layer 66 and the interlayer insulating film 53 are made of the same material, the shape of the slit 60 is lost at the stage of forming the insulating layer 66 on the interlayer insulating film 53. Thus, in the first embodiment, after the slit 60 is formed, a stopper film 59 is formed. In other words, the shape of the slit 60 remains as long as the stopper film 59 remains.

Furthermore, the insulating layer 66 is covered with a select gate electrode layer 45L. The material of the select gate electrode layer 45L is boron-doped polysilicon. Furthermore, the select gate electrode layer 45L is covered with an insulating layer 67 (fifth insulating layer).

Figures 13A, 13B:
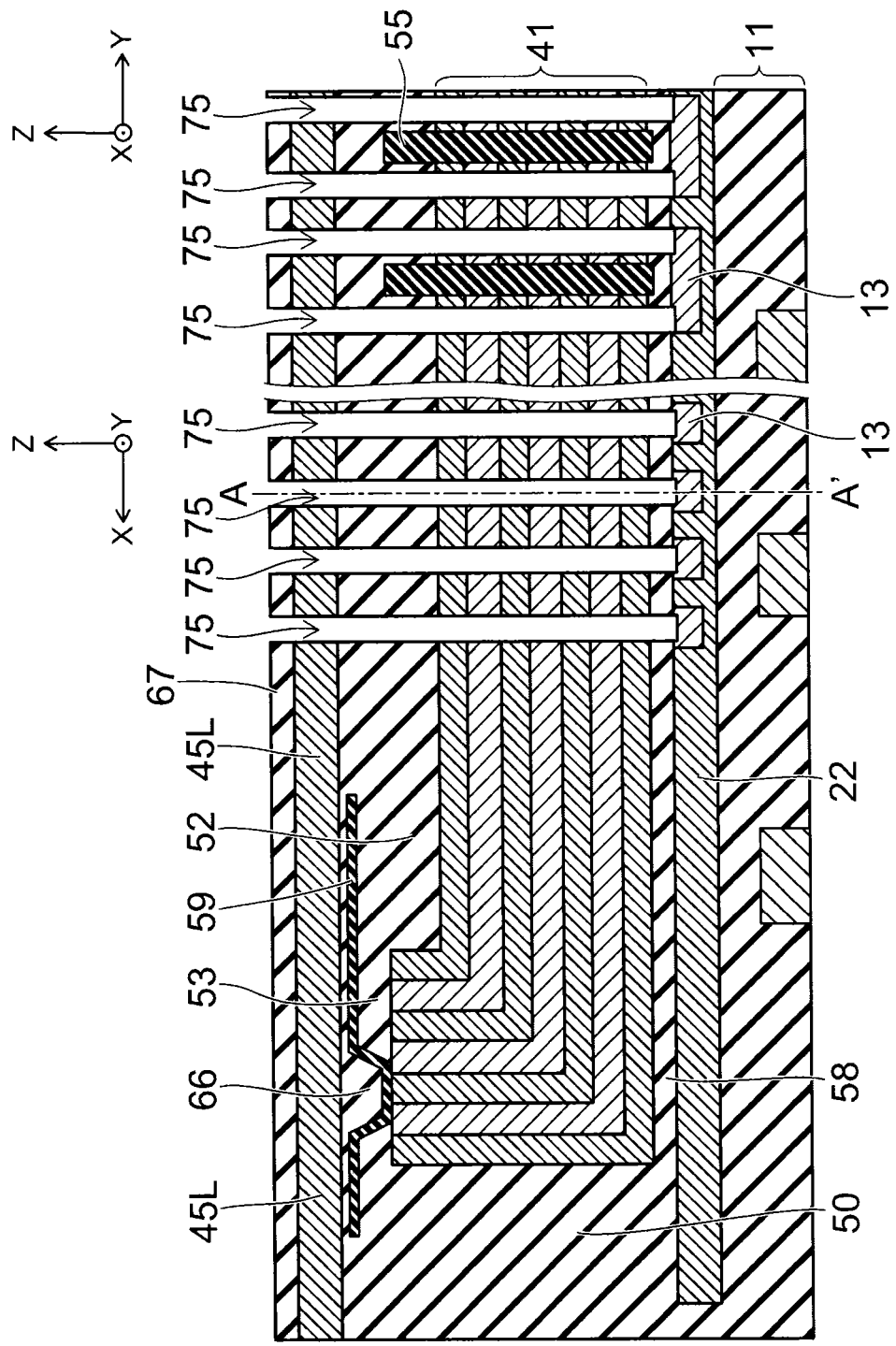
FIGS. 13A to 13B are schematic sectional views describing the process for manufacturing a nonvolatile semiconductor memory device according to the first embodiment.

Next, as shown in FIGS. 13A and 13B, a pair of holes 75 extending from the surface of the insulating layer 67 to the sacrificial layer 13 are formed. The pair of holes 75 are formed on both sides of the insulating layer 55 so as to penetrate through the insulating layer 67, the select gate electrode layer 45L, the interlayer insulating film 53, the insulating layer 52, the stacked body 41, and the insulating layer 58. The pair of holes 75 are formed by e.g. photolithography and etching.

Figures 14A, 14B:
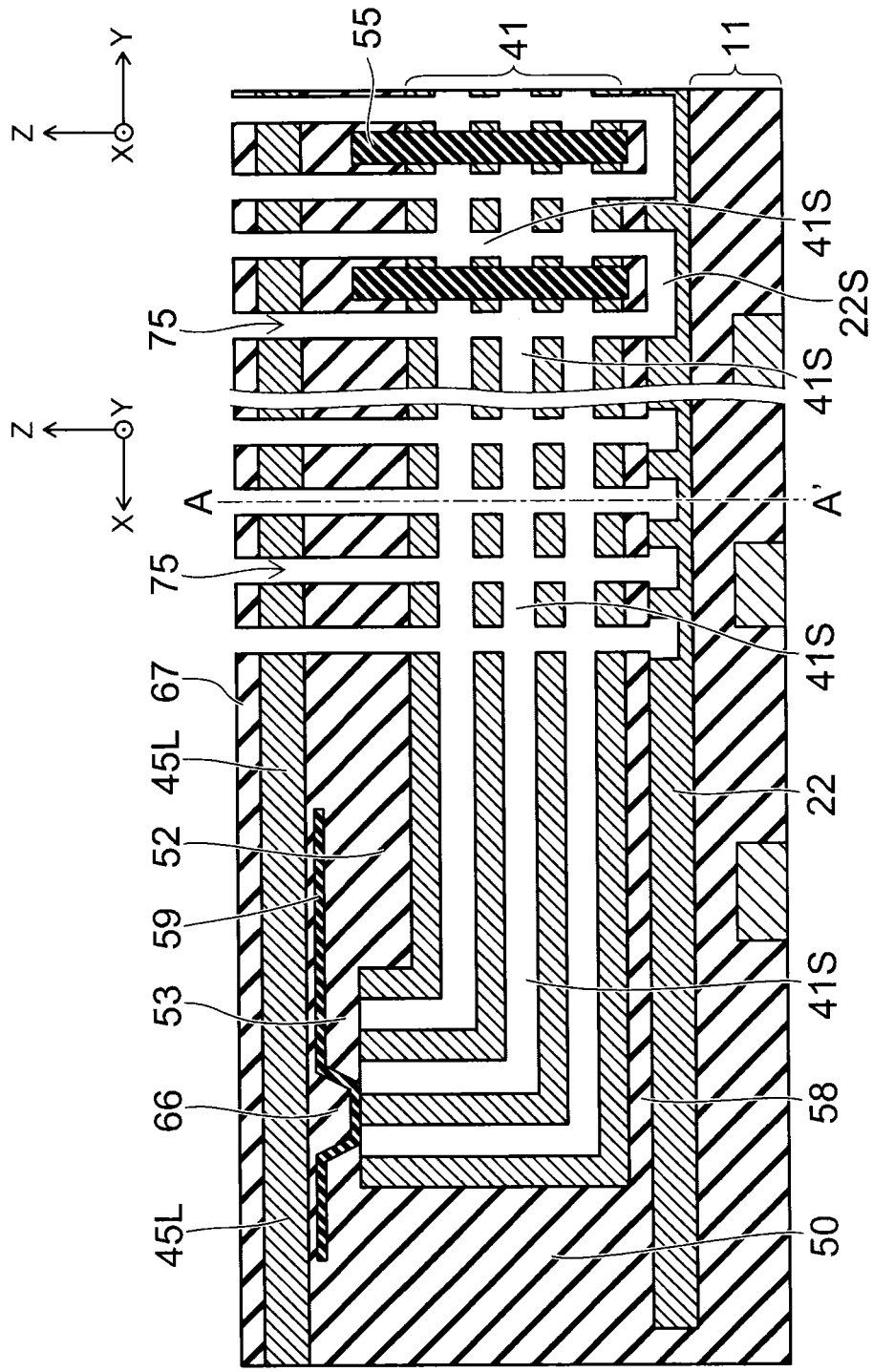
FIGS. 14A to 14B are schematic sectional views describing the process for manufacturing a nonvolatile semiconductor memory device according to the first embodiment.

Next, as shown in FIGS. 14A and 14B, the sacrificial layer 13 and the plurality of sacrificial layers 37 are removed through the plurality of holes 75. For instance, the sacrificial layers 13, 37 including non-doped polysilicon are dissolved by introducing alkaline chemical treatment into the plurality of holes 75, and removed through the plurality of holes 75. Thus, a space portion 22S (first space portion) linked with the lower ends of a pair of holes 75 is formed in the back gate layer 22. Furthermore, a space portion 41S (second space portion) is formed between the plurality of electrode layers 40.

Figures 15A, 15B:
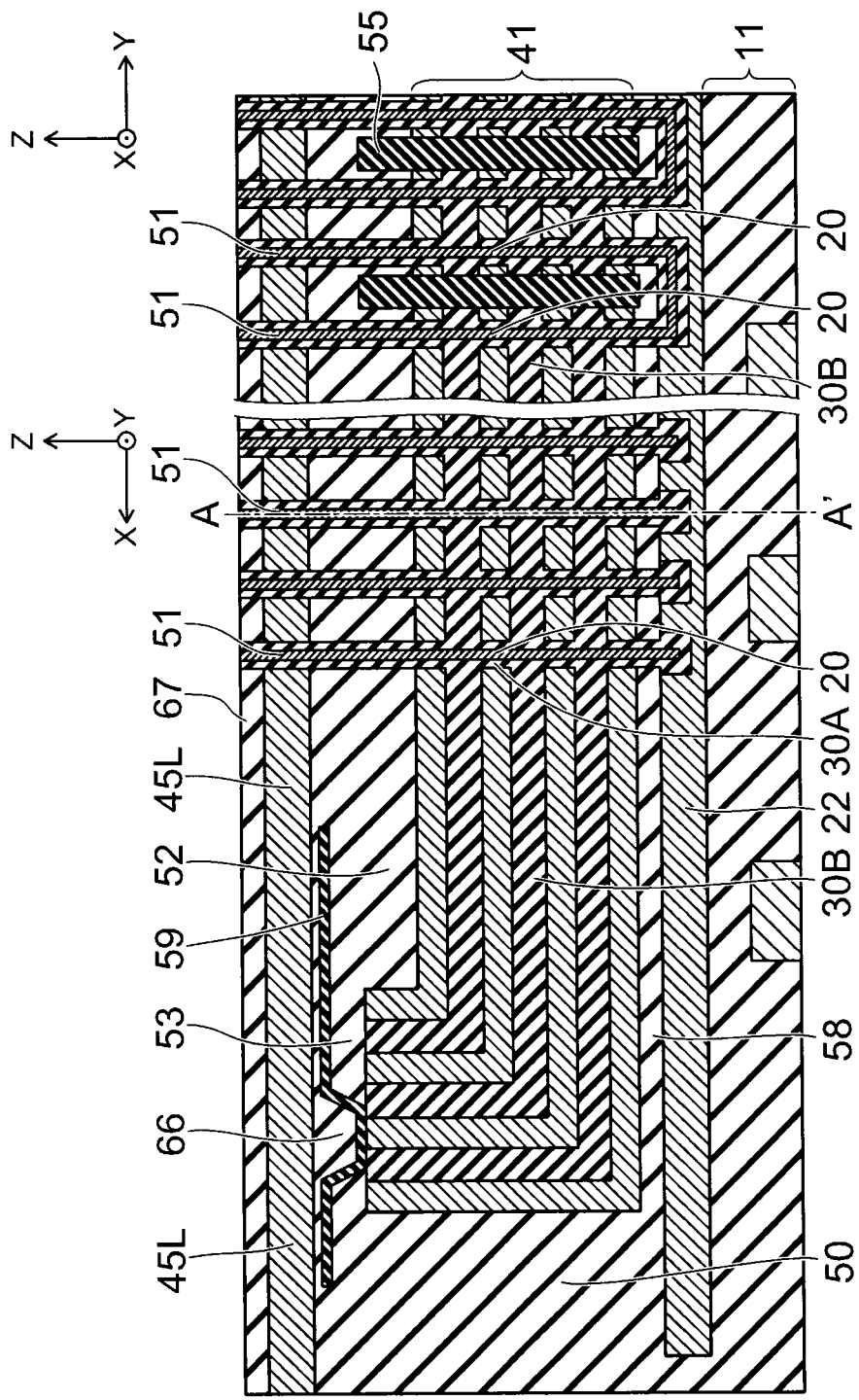
FIGS. 15A to 15B are schematic sectional views describing the process for manufacturing a nonvolatile semiconductor memory device according to the first embodiment.

Next, as shown in FIGS. 15A and 15B, a layer including a charge accumulation film 32 is formed on each inner wall of the plurality of holes 75, on the inner wall of the space portion 22S, and in the space portion 41S. Furthermore, channel body layers 20, 51 are formed on each inner wall of the plurality of holes 75 and the inner wall of the space portion 22S. Thus, as shown in FIG. 2, an insulating layer 30B is formed between the plurality of electrode layers 40, and a memory film 30A is formed between the channel body layer 20 and each of the plurality of electrode layers 40. The material of the channel body layers 20, 51 is e.g. polysilicon.

Figures 16A, 16B:
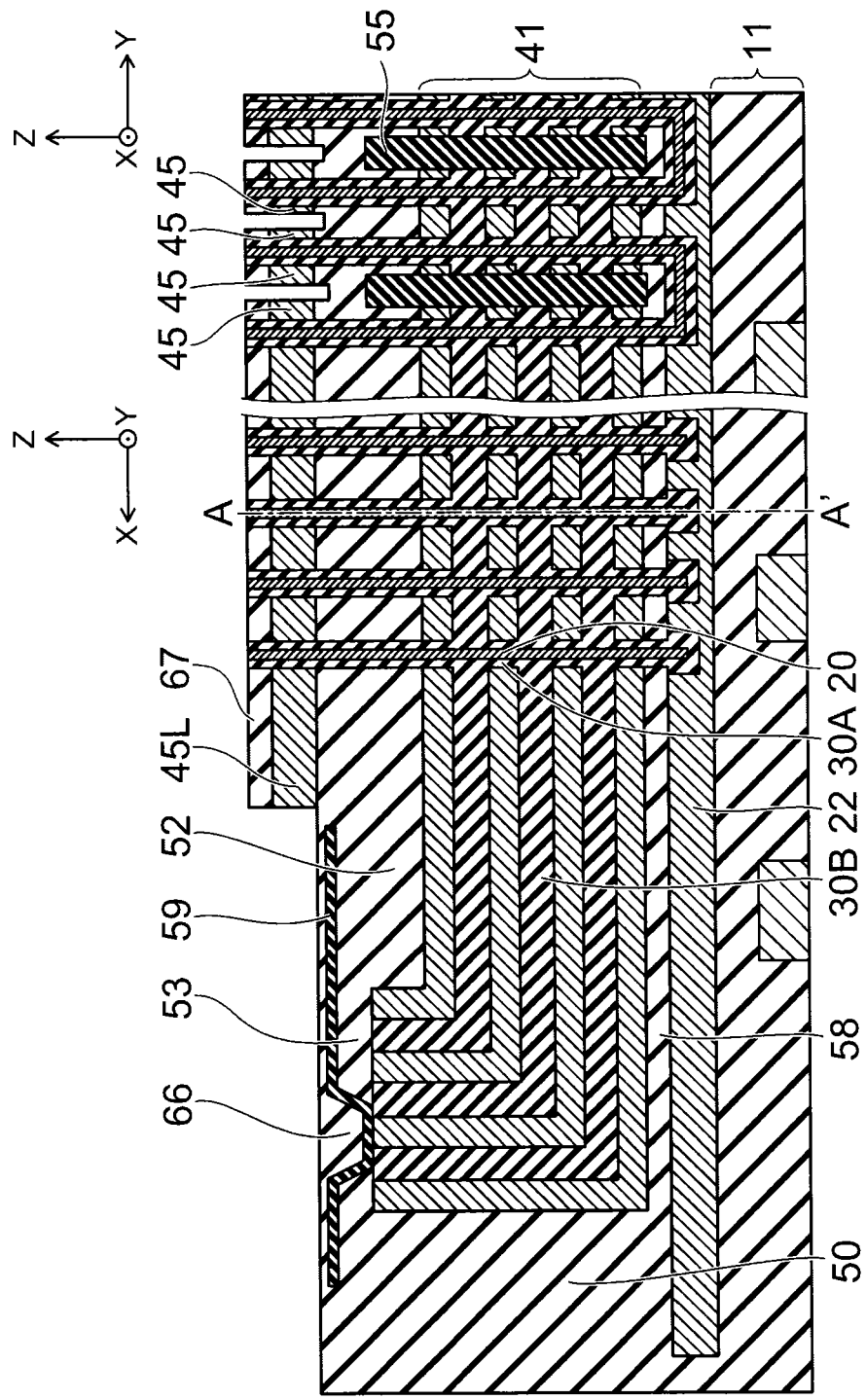
FIGS. 16A to 16B are schematic sectional views describing the process for manufacturing a nonvolatile semiconductor memory device according to the first embodiment.

Next, as shown in FIGS. 16A and 16B, the select gate electrode layer 45L and the insulating layer 67 provided on the end surfaces 40E of the plurality of electrode layers 40 are removed. Furthermore, the select gate electrode layer 45L in contact with the channel body layer 51 via the insulating layer is divided to form select gate electrodes 45. The division of the select gate electrode layer 45L is performed by e.g. photolithography and etching.

Figures 17A, 17B:
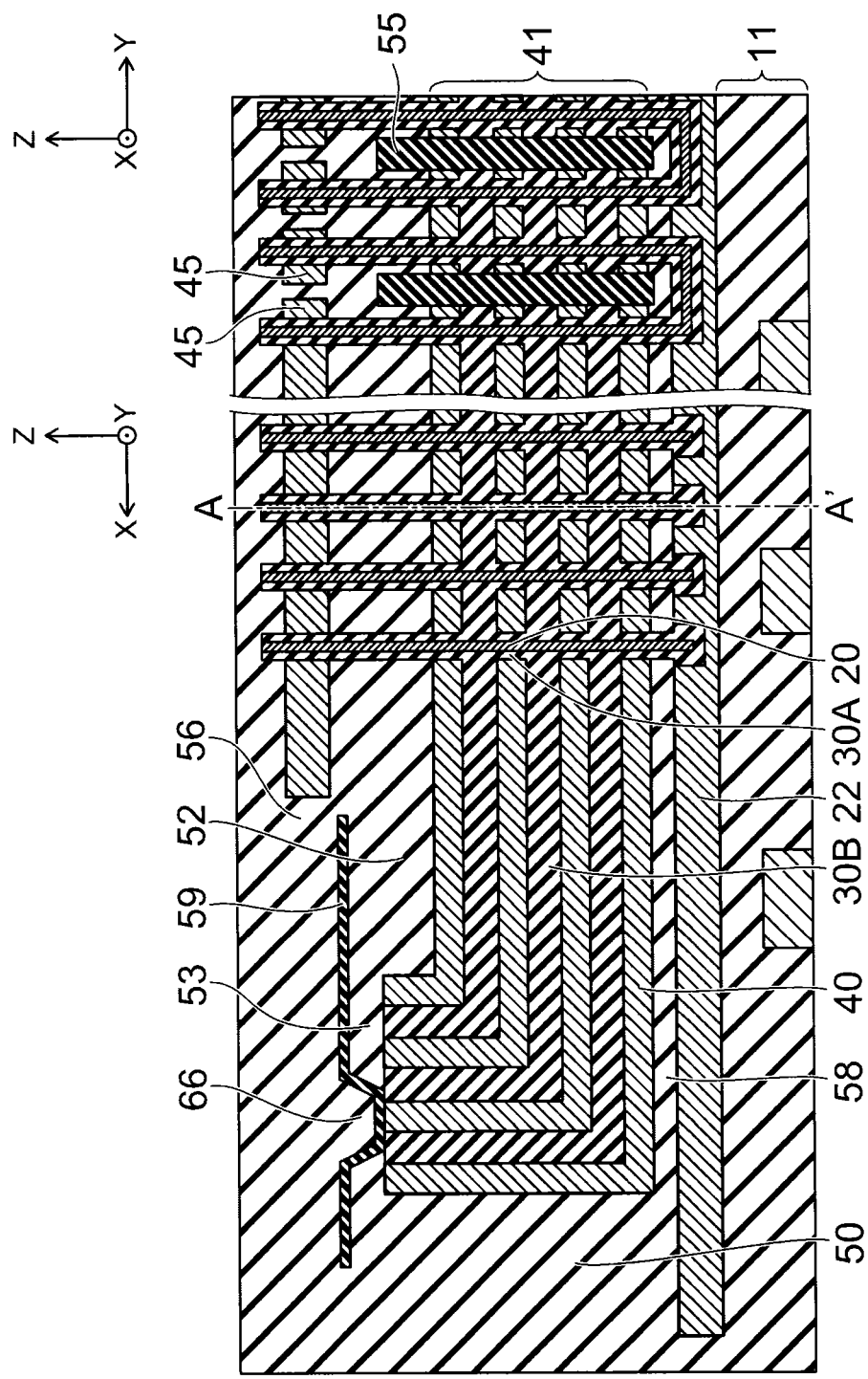
FIGS. 17A to 17B are schematic sectional views describing the process for manufacturing a nonvolatile semiconductor memory device according to the first embodiment.

Next, as shown in FIGS. 17A and 17B, the stopper film 59 is covered with an interlayer insulating film 56 (second interlayer insulating film).

Figures 18A, 18B:
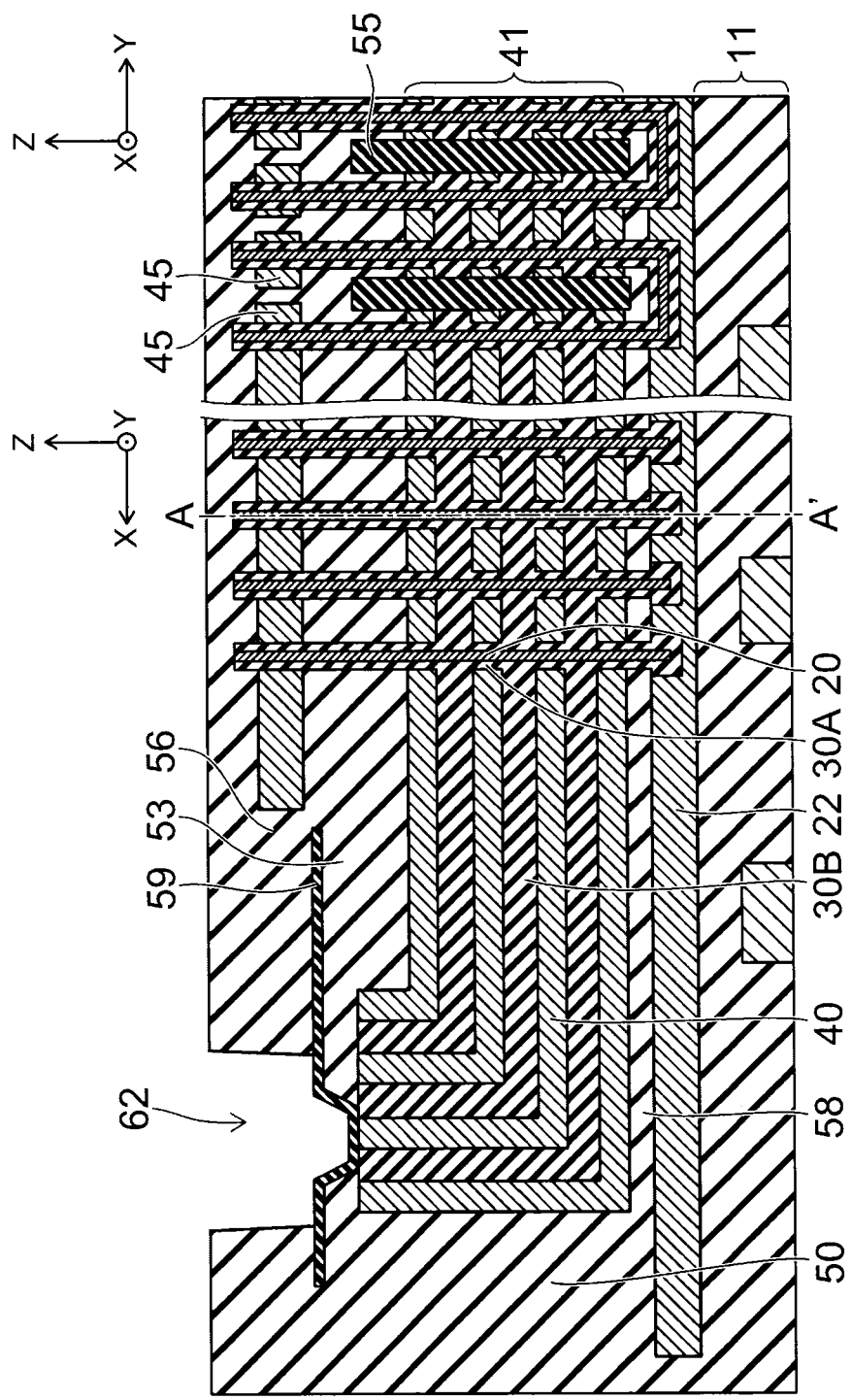
FIGS. 18A to 18B are schematic sectional views describing the process for manufacturing a nonvolatile semiconductor memory device according to the first embodiment.

Next, as shown in FIGS. 18A and 18B, a plurality of contact holes 62 are formed in the interlayer insulating film 56. Each of the plurality of contact holes 62 is formed at a position on part of the end surface 40E of the electrode layer 40 exposed from the interlayer insulating film 53 by the slit 60 provided therein.

As described above, the line width of the first line pattern is denoted by "La", and the line width of the second line pattern is denoted by "Lb". Then, the inner diameter R of the contact hole is adjusted to be larger than La+2×Lb.

The formation of the contact holes 62 is performed by e.g. photolithography and etching. Furthermore, the etching is continued to remove the insulating layer 66 provided in the slit 60. Here, the stopper film 59 functions as a stopper layer for stopping etching. Thus, with the stopper film 59 remaining, the insulating layer formed above the stopper film 59 is removed by etching.

Next, the etching condition is switched so that the stopper film 59 can be removed. Then, as shown in FIGS. 19A to 19D, the stopper film 59 is removed by etching. Thus, part of at least one end surface 40E of the plurality of electrode layers 40 can be exposed from the interlayer insulating film 56 by the slit 60 and the contact hole 62 provided therein. That is, at least one end surface 40E of the plurality of electrode layers 40 is exposed through the slit 60 and the contact hole 62. In this case, the inner diameter R of the contact hole 62 is equal to the central axis of the slit 60 between both ends of the slit 60. Furthermore, part of each of two or more end surfaces 40E of the plurality of electrode layers 40 is exposed from the interlayer insulating film 53 by a plurality of slits 60 provided therein. Here, the plurality of slits 60 exposing part of two or more end surfaces 40E are arranged on the same line.

Next, as shown in FIGS. 20A to 20D, a conductive layer 64 is formed in the slit 60 and in the contact hole 62. Then, as shown in FIGS. 3A and 3B, various interconnects, interlayer insulating films and the like are formed. By the manufacturing process described above, the nonvolatile semiconductor memory device 1 is formed.

The effect of the first embodiment is now described.

Before describing the effect of the first embodiment, a nonvolatile semiconductor memory device 100 according to a reference example is described.

Figure 21A:
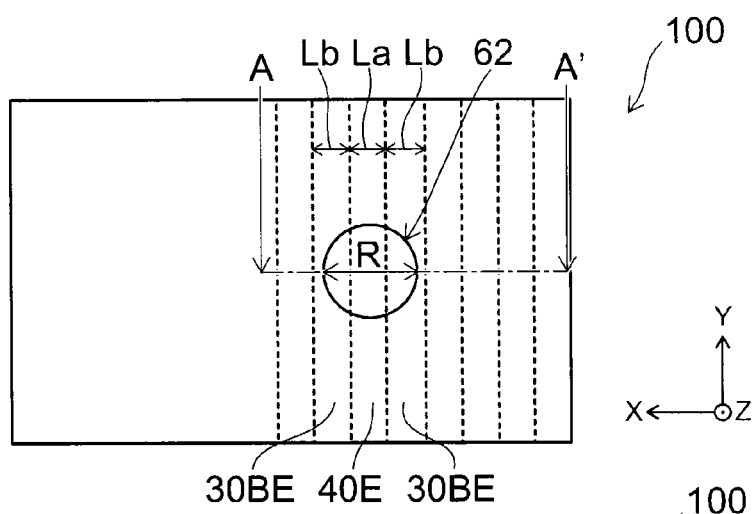
FIGS. 21A and 21B are schematic views of the nonvolatile semiconductor memory device according to the reference example.
Figure 21B:
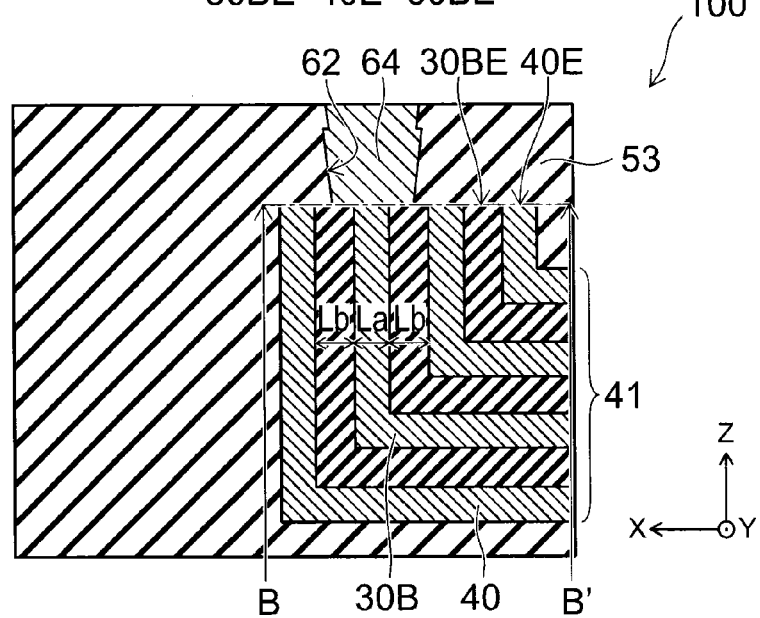

FIGS. 21A and 21B are schematic views of the nonvolatile semiconductor memory device according to the reference example. FIG. 21A is a schematic plan view of the B-B' cross section of FIG. 21B. FIG. 21B is a schematic sectional view of the A-A' cross section of FIG. 21A.

Also in the nonvolatile semiconductor memory device 100 according to the reference example, part of the stacked body 41 is bent so that the end surface 40E of the electrode layer 40 and the end surface 30BE of the insulating layer 30B face upward from the foundation layer.

However, in the nonvolatile semiconductor memory device 100 according to the reference example, the slit 60 is not formed. Thus, in the reference example, in the case of electrically connecting the electrode layer 40 and the conductive layer 64, the inner diameter R of the contact hole 62 needs to be adjusted to less than La+2×Lb. The reason for this is that if the inner diameter R of the contact hole 62 is set to be larger than or equal to La+2×Lb, the end surfaces 40E of the adjacent electrode layers 40 are exposed from the bottom of the contact hole 62. Thus, a short circuit occurs between the adjacent electrode layers 40 by the conductive layer 64.

That is, in the reference example, there is a restriction that the inner diameter R of the contact hole 62 needs to be adjusted to less than La+2×Lb. Such a restriction is not eliminated even if the line width of the end surface 40E of the electrode layer 40 becomes smaller with the miniaturization of the stacked body 41. Thus, for instance, control of the inner diameter R by photolithography and etching, and alignment of the contact hole 62 become increasingly difficult with the miniaturization of the stacked body 41.

Furthermore, the reference example needs contact holes 62 corresponding to the number of the plurality of electrode layers 40. Thus, the pattern of the contact hole results in a dense pattern. Here, the dense pattern is defined as a pattern in which patterns exist on both sides thereof.

In the case of a dense pattern, the etching condition is generally susceptible to the pattern density. This requires considerable time and cost until a desired etching condition is adopted. That is, in the reference example, there is a limit to cost reduction. Furthermore, in the case of a dense pattern, there is also a restriction that the inner diameters of the plurality of patterns need to be simultaneously controlled, and alignment of the plurality of patterns needs to be simultaneously controlled.

In contrast, in the first embodiment, part of at least one end surface 40E of the plurality of electrode layers 40 can be exposed from the interlayer insulating film 53 by the slit 60 provided therein (see FIGS. 4A and 4B). This slit 60 extends in a direction non-parallel to the extending direction of the end surface 40E of the plurality of electrode layers 40. Furthermore, if the aforementioned "θ" is given by $\theta = \tan^{-1}(w/h)$, the slit 60 is provided on the diagonal of the rectangular region 70. That is, during the process, the end surfaces 40E of all the electrode layers 40 in the rectangular region 70 can be exposed from the interlayer insulating film 53 by one slit 60 provided therein (see FIGS. 10A to 10D).

Furthermore, the slit pattern is an isolated pattern in which no pattern exists on both sides thereof. Thus, the etching condition is less susceptible than to the dense pattern. This significantly reduces time and cost until a desired etching condition is adopted. Furthermore, in the case of an isolated pattern, it is only necessary to control the isolated pattern alone. Thus, there is no restriction of inner diameter control and alignment control of the plurality of patterns described above.

In the first embodiment, even if the inner diameter R of the contact hole 62 is set to be larger than or equal to La+2×Lb, no short circuit occurs between the adjacent electrode layers 40. This is because the slit 60 is provided in the contact hole 62 and exposes only one electrode layer 40 from the interlayer insulating film 53.

That is, in the first embodiment, even if the line width of the end surface 40E of the electrode layer 40 becomes smaller with the miniaturization of the stacked body 41, the inner diameter R of the contact hole 62 can be adjusted to be larger than or equal to La+2×Lb. Thus, even with the miniaturization of the stacked body 41, the difficulty in forming the contact hole 62 is lower than in the reference example. For instance, even with the miniaturization of the stacked body 41, for instance, adjustment of the inner diameter R by photolithography and etching, and alignment of the contact hole 62 are easier than in the reference example.

In the first embodiment, the stopper film 59 used during the process is also a factor in allowing expansion of the inner diameter R of the contact hole 62. If the stopper film 59 is not provided, then when the etching for forming a contact hole 62 is excessive, the adjacent electrode layers 40 may be exposed from the bottom of the contact hole 62. This is because the inner diameter R of the contact hole 62 is larger than or equal to La+2×Lb. That is, in the first embodiment, the progress of etching for forming a contact hole 62 is limited by the stopper film 59. This allows expansion of the inner diameter R of the contact hole 62.

In the first embodiment, as the line width of the slit 60 becomes narrower, electrical contact between the adjacent electrode layers 40 becomes less likely to occur. Furthermore, the contact resistance between the conductive layer 64 and the electrode layer 40 is reduced as the line width of the slit 60 becomes wider. The line width of the slit 60 is appropriately adjusted depending on the purpose of the nonvolatile semiconductor memory device 1.

In the first embodiment, as the aforementioned angle θ comes closer to 90°, electrical contact between the adjacent electrode layers 40 becomes less likely to occur.

In the configuration illustrated in FIGS. 3A, 3B and the like, the stopper film 59 is entirely removed from inside the contact hole 62. However, the stopper film 59 may be left on the inner wall of the slit 60 as long as there is no problem in the electrical contact between the conductive layer 64 and the electrode layer 40.

Thus, according to the first embodiment, the margin of conditions for forming the contact hole is expanded. Furthermore, the manufacturing cost is reduced.

Second Embodiment

In the first embodiment, one slit 60 is illustrated in FIGS. 10A to 10D. However, the number of slits 60 is not limited to one.

Figure 22C:
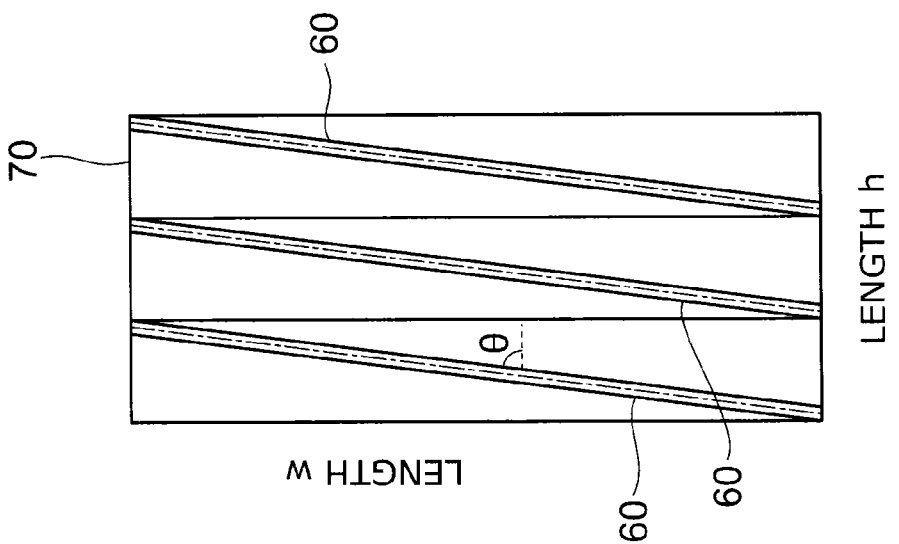
FIGS. 22A to 22C are schematic plan views of nonvolatile semiconductor memory devices according to a second embodiment.
Figure 22B:
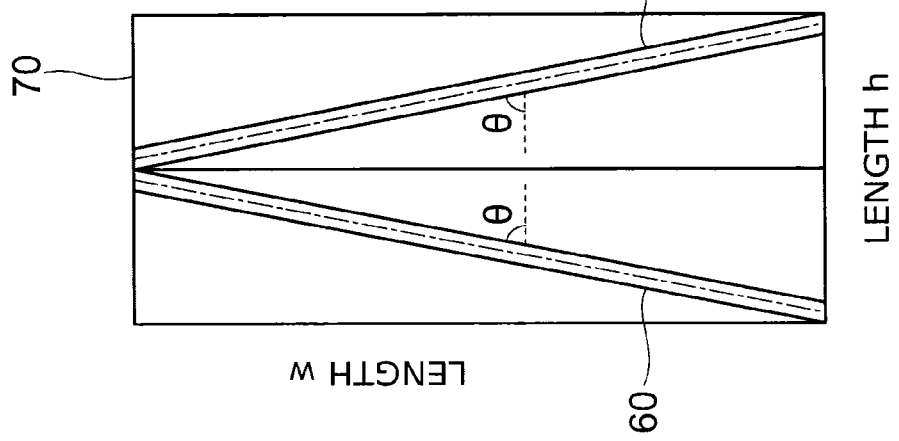
Figure 22A:
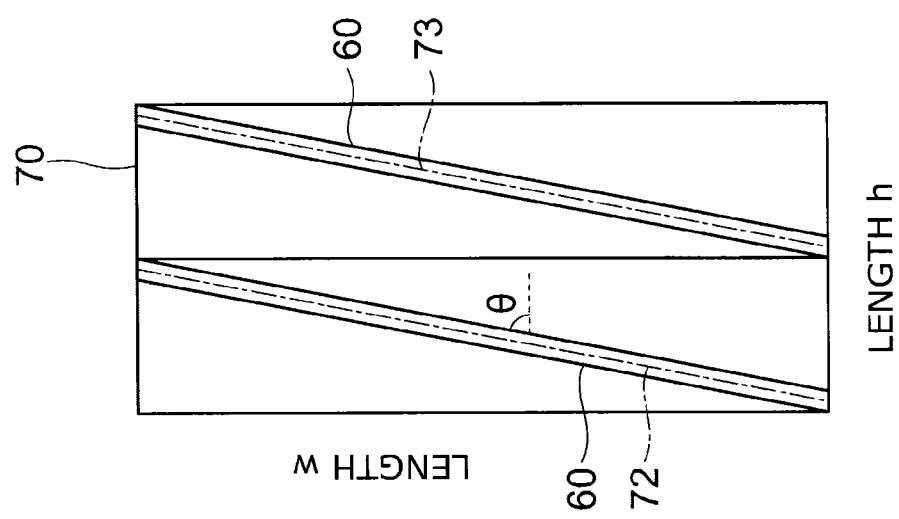

FIGS. 22A to 22C are schematic plan views of nonvolatile semiconductor memory devices according to a second embodiment.

For instance, as shown in FIG. 22A, two slits 60 may be formed in the rectangular region 70 during the process. The two slits 60 extend on a first line 72 and on a second line 73, respectively. The first line 72 and the second line 73 are parallel. Also in this case, part of each end surface of the plurality of electrode layers 40 is exposed from the interlayer insulating film 53 by the slits 60 provided therein.

An insulating layer 66 is formed in these slits 60 via a stopper film 59. Furthermore, a plurality of contact holes 62 are formed. Then, the slits 60 exposed in the plurality of contact holes 62 are arranged on the first line 72 and the second line 73.

Furthermore, as shown in FIG. 22B, the first line 72 and the second line 73 may be axisymmetric. Alternatively, as shown in FIG. 22C, three slits 60 may be formed in the rectangular region 70. Furthermore, four or more slits 60 may be formed in the rectangular region 70 (not shown). During the process, part of each end surface 40E of the plurality of electrode layers 40 is exposed from the interlayer insulating film by the plurality of slits 60 provided therein. The plurality of slits 60 exposing part of the end surface 40E are arranged on the first line 72 and the second line 73.

The angle "θ" in the case where the slit 60 and the first line pattern are parallel is 90°. Thus, the angle θ between the second side and the slit 60 is given by $\tan^{-1}(w/h) \leq \theta < 90°$. Accordingly, also in the case of providing a plurality of slits 60, an effect similar to that of the first embodiment is achieved.

Third Embodiment

Figure 23:
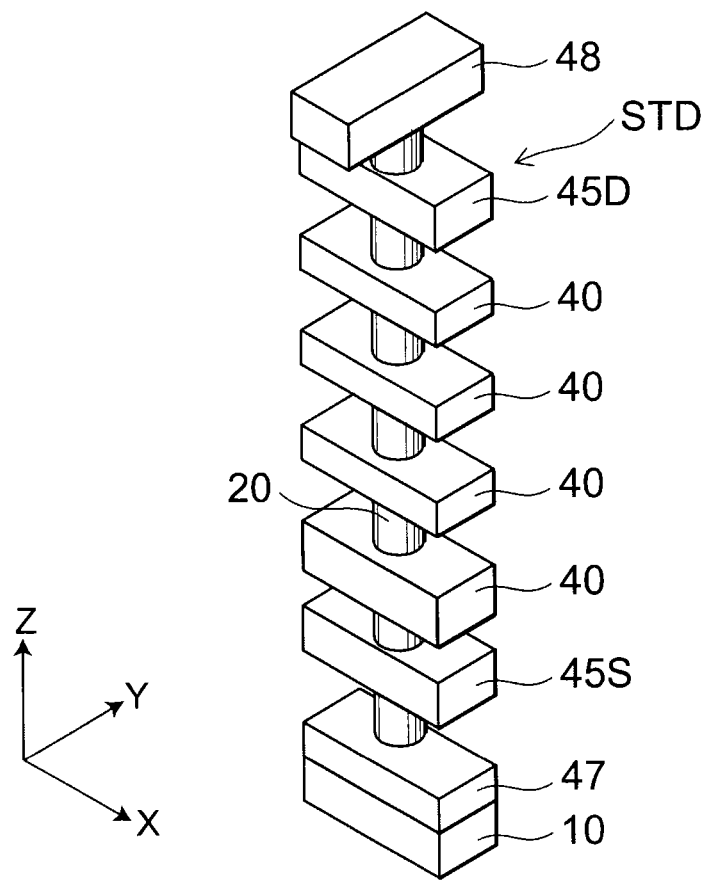
FIG. 23 is a schematic perspective view of a nonvolatile semiconductor memory device according to a third embodiment.

FIG. 23 is a schematic perspective view of a nonvolatile semiconductor memory device according to a third embodiment.

In the first embodiment, a U-shaped memory string is illustrated. However, as shown in FIG. 23, a straight memory string is also possible. Such a configuration is also included in the present embodiments.

When such terms as "insulating layer", "insulating film", and "insulating material" are mentioned in the present embodiments, the material thereof includes silicon oxide, silicon nitride and the like. When such terms as "semiconductor" are mentioned in the present embodiments, the material thereof includes silicon and the like.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
   a foundation layer;
   a stacked body provided on the foundation layer and including a plurality of electrode layers and a plurality of insulating layers alternately stacked;
   a plurality of first channel body layers extending from an upper surface of the stacked body through the stacked body to a lower surface of the stacked body;
   a memory film provided between each of the plurality of first channel body layers and each of the plurality of electrode layers;
   a first interlayer insulating film provided on the stacked body;
   a plurality of select gate electrodes provided on the first interlayer insulating film;
   a second channel body layer penetrating through each of the plurality of select gate electrodes and the first interlayer insulating film, and the second channel body layer being connected to each of the plurality of first channel body layers; and
   a gate insulating film provided between each of the plurality of select gate electrodes and the second channel body layer,
   the stacked body being bent, and each end surface of the plurality of electrode layers and each end surface of the plurality of insulating layers face upward from the foundation layer,
   the first interlayer insulating film including a slit extending in a direction generally parallel to the upper surface of the stacked body, and the slit extending in a direction non-parallel to a first direction in which each end surface of the plurality of electrode layers extends, and part of at least one end surface of the plurality of electrode layers being part of bottom of the slit.

2. The device according to claim 1, further comprising:

a second interlayer insulating film on the first interlayer insulating film, wherein the second interlayer insulating film is provided with a contact hole, and the slit is linked to the contact hole at bottom of the contact hole.

3. The device according to claim 1, wherein

"w" denotes a length of a first side in the first direction of a rectangular region, the rectangular region is made of a plurality of first line patterns and a plurality of second line patterns, the plurality of first line patterns are formed from the end surfaces of the plurality of electrode layers, and the plurality of second line patterns are formed from the end surfaces of the plurality of insulating layers, and "h" denotes a length of a second side of the rectangular region in a direction in which the plurality of first line patterns and the plurality of second line patterns are alternately arranged, angle θ between the second side and the slit is given by $\tan^{-1}(w/h) \leq \theta < 90°$.

4. The device according to claim 3, wherein "La" denotes a line width of each of the first line patterns, and "Lb" denotes a line width of each of the second line patterns, inner diameter R of the contact hole is larger than or equal to $La+2 \times Lb$.

5. The device according to claim 2, wherein inner diameter R of the contact hole is equal to length of central axis of the slit between both ends of the slit.

6. The device according to claim 1, wherein each of a plurality of the slits is arranged on a first line.

7. The device according to claim 1, wherein each of a plurality of the slits is arranged on a first line and a second line different from the first line.

8. The device according to claim 7, wherein the first line and the second line are parallel.

9. The device according to claim 7, wherein the first line and the second line are axisymmetric.

10. The device according to claim 2, further comprising:

a conductive layer provided in the slit and in the contact hole.

11. The device according to claim 1, wherein the stacked body extends in a direction generally perpendicular to an arranging direction of the pair of first channel body layers, and part of the stacked body is bent at a generally right angle, and the end surface of the plurality of electrode layers and the end surface of the plurality of insulating layers are generally parallel to the upper surface of the stacked body.

* * * * *